United States Patent
Kakemura et al.

(10) Patent No.: US 8,062,716 B2
(45) Date of Patent: Nov. 22, 2011

(54) METHOD FOR FORMING THIN FILM, APPARATUS FOR FORMING THIN FILM, AND METHOD FOR MONITORING THIN FILM FORMING PROCESS

(75) Inventors: Toshiaki Kakemura, Koshigaya (JP); Hiroto Kashima, Tokyo (JP); Manabu Tsujino, Kasukabe (JP)

(73) Assignee: Toppan Printing Co., Ltd., Tokyo (JP)

( * ) Notice: Subject to any disclaimer, the term of this patent is extended or adjusted under 35 U.S.C. 154(b) by 1261 days.

(21) Appl. No.: 10/529,362

(22) PCT Filed: Sep. 26, 2003

(86) PCT No.: PCT/JP03/12334
§ 371 (c)(1),
(2), (4) Date: Mar. 28, 2005

(87) PCT Pub. No.: WO2004/031440
PCT Pub. Date: Apr. 15, 2004

(65) Prior Publication Data
US 2005/0271818 A1 Dec. 8, 2005

(30) Foreign Application Priority Data

Sep. 30, 2002 (JP) .................................. 2002-287847
Jul. 30, 2003 (JP) .................................. 2003-282653

(51) Int. Cl.
*H05H 1/24* (2006.01)
(52) U.S. Cl. ........................................................ 427/569
(58) Field of Classification Search .................. 427/237, 427/255.27, 579
See application file for complete search history.

(56) References Cited

U.S. PATENT DOCUMENTS

| | | | |
|---|---|---|---|
| 4,888,199 A | 12/1989 | Felts et al. | |
| 5,569,497 A * | 10/1996 | Verzaro et al. | 427/489 |
| 5,904,952 A | 5/1999 | Lopata et al. | |
| 5,965,203 A | 10/1999 | Gabric et al. | |
| 6,152,071 A | 11/2000 | Akiyama et al. | |
| 2002/0122897 A1* | 9/2002 | Namiki et al. | 427/569 |
| 2004/0083964 A1* | 5/2004 | Ingle et al. | 118/715 |

FOREIGN PATENT DOCUMENTS

| | | |
|---|---|---|
| CA | 2 048 168 | 2/1992 |
| EP | 0 299 752 A2 | 1/1989 |
| EP | 0 299 754 A2 | 1/1989 |

(Continued)

OTHER PUBLICATIONS

Office Action issued in corresponding Japanese Patent Application No. 2002-287847; mailed on May 7, 2008.
Decision on Grant issued on Sep. 14, 2007 to the corresponding Russian application 2005108974.
Japanese Patent Office Notice of Submission of Published Documents, mailed on Oct. 10, 2006, and issued in counterpart Japanese Patent Application No. 2002-287847.

*Primary Examiner* — Timothy Meeks
*Assistant Examiner* — Elizabeth Burkhart

(57) ABSTRACT

A thin film forming method for plasmatizing a mixture gas, the mixture gas being made up of a monomer gas and an oxidizing reactive gas, and for forming a thin film on a surface of a substrate, the thin film being made of an oxide. The method includes forming a first thin film by plasmatizing the mixture gas while varying a supply flow amount ratio of the monomer gas with respect to the reactive gas and forming a final thin film by increasing the supply flow amount ratio of the monomer gas with respect to the reactive gas after the forming of the first film.

5 Claims, 9 Drawing Sheets

FOREIGN PATENT DOCUMENTS

| | | |
|---|---|---|
| EP | 0 469 926 | 2/1990 |
| EP | 0 469 926 | 2/1992 |
| EP | 0 469 926 A1 | 2/1992 |
| EP | 0 741 196 | 11/1999 |
| JP | 62-89869 | 4/1987 |
| JP | 62-93382 | 4/1987 |
| JP | 64-087772 | 3/1989 |
| JP | 64-087777 | 3/1989 |
| JP | 06-108255 | 4/1994 |
| JP | 8-053117 | 2/1996 |
| JP | 8-146358 | 6/1996 |
| JP | 8-175528 | 7/1996 |
| JP | 08-306685 | 11/1996 |
| JP | 08-316214 | 11/1996 |
| JP | 10-168575 | 6/1998 |
| JP | 11-181570 | 7/1999 |
| JP | 2000-255579 * | 9/2000 |
| JP | 2001-220679 | 8/2001 |
| JP | 2001-335945 | 12/2001 |
| RU | 2 165 476 | 4/2001 |
| RU | 2 188 878 | 9/2002 |

* cited by examiner

METHOD FOR FORMING THIN FILM, APPARATUS FOR FORMING THIN FILM, AND METHOD FOR MONITORING THIN FILM FORMING PROCESS

This application claims the benefit under 35 U.S.C. §371, of International Application Number PCT/JP03/12334, filed Mar. 28, 2005, which claimed priority to the Japanese Patent Applications 2003-282653, filed Jul. 30, 2003 and 2002-287847, filed Sep. 30, 2002 in the Japanese Patent Office, the disclosures of which are thereby incorporated by reference.

TECHNICAL FIELD

The present invention relates to a thin film forming method and to a thin film forming device for forming a thin film, which is made of an oxide, on a substrate such as a plastic container. Also, the present invention relates to a thin film forming process monitoring method and to a thin film forming device for forming a silicon oxide thin film on a surface of a substrate by plasmatizing a mixture gas including an organosilicon compound gas and an oxidizing gas.

BACKGROUND ART

Plastic containers are used for packaging and containing purposes in various fields such as beverages, foods, toiletry goods, and medicines because they not only have a superior hardness, light weight, and superior moldability, but are also cost efficient, difficult to break, and easy to re-seal.

Although plastic containers have these advantages, plastic containers also have disadvantages in that a low molecular gas such as oxygen and carbon dioxide can be transmitted therethrough. Such a disadvantage is called low gas impermeability because gas impermeability is low. Occasionally, some of the contents in the container are affected undesirably by such gases. Here, various attempts for improving the gas impermeability of plastics have been made when producing containers industrially. Among such attempts, one method is realized, in which a material having a high gas impermeability and made of an inexpensive common material is formed in a multi-layer structure.

However, it is difficult to recycle a material having a multilayered structure which consists of at least two kinds of material. Thus, there was a problem from an ecological point of view because a material having a multi-layer structure must be discarded after usage. Therefore, other attempts have been made for reducing a material having a high gas impermeability as much as possible until the material having a high gas impermeability has no effect on recycling. However, quite often, it was not possible to realize a desirable gas impermeability in a material having a multi-layer structure.

Currently, in order to realize a recycling ability and gas impermeability to oxygen, carbon monoxide, and steam, a method has been proposed in which a thin film having gas impermeability is formed on the inner surface of a container made by commonly-used plastics. One thin film forming method is a plasma-assisted CVD method, in which a thin film is formed on the inner surface of a container by plasmatizing a process gas and reacting the process gas chemically. Specifically, the plasma-assisted CVD method, in which a container is disposed between a hollow high frequency electrode having a shape which is approximately the same as the outer shape of the container, and an inner electrode having a shape which is approximately the same as the inner shape of the container, is known in the art (see, for example, patent document 1). As another form of the plasma-assisted CVD method, both the high frequency electrode and the inner electrode are disposed away from a surface of the container by approximately the same distance (see a patent document 2).

Patent Document 1: Japanese Unexamined Patent Application, First Publication No. H8-53117
Patent Document 2: Japanese Unexamined Patent Application, First Publication No. H8-175528

However, even if a thin film is formed by these methods, it is still difficult to control strictly flow ratio of a reactive gas and a monomer gas in the plasmatized process gas. As a result, there has been a problem in that it was not possible to stably form a thin film having a sufficient gas impermeability, and in that, the gas impermeability varied even among the produced containers. Furthermore, there has been another problem in that the gas impermeability of the thin film decreases because the produced thin film does not have sufficient flexibility, and finally, cracking occurs on the thin film when using the container.

Also, a thin film has been formed on the inner surface of not only plastic container, but also, for example, glass container in order to prevent lead, cadmium, etc., from melting in the contents of the containers. For that case, it is necessary to form the thin film stably without variation.

Also, a thin film having gas impermeability has been formed on the inner surface of plastic containers in order to add gas impermeability. For that purpose, a plasma-assisted CVD method (hereinafter, a plasma CVD method), in which a thin film is formed on the inner surface of the plastic container by plasmatizing a process gas and reacting the plasmatized process gas chemically, is known in the art.

It was not possible to know whether or not the thin film has a desirable surface quality during forming the thin film by the plasma CVD method. Therefore, conventionally, a thin film has been produced while monitoring parameters (for example, degree of vacuum, applied power, and introduced gas flow amount), and after that, whether or not the produced thin film had a desirable surface quality has been evaluated. However, the monitoring of the parameters, such as the degree of vacuum, applied power, and introduced gas flow amount, has not yet achieved the desirable surface quality of the produced thin film. Therefore, a more improved process monitoring method is needed.

For that purpose, a method in which a plasma emission is monitored has been proposed. This method is called a plasma diagnosis, in which it is possible to obtain information concerning the actual inner structure of a plasma by monitoring emission of the plasma. By employing this method, it is possible to forecast the surface quality of the thin film accurately.

For example, a method is proposed in which whether or not a process is conducted properly is determined by monitoring a ratio between the intensity of hydrogen alpha rays and the intensity of hydrogen beta rays, which are radiated from a plasma, or by monitoring a ratio between the hydrogen alpha rays or beta rays, and the intensity of helium radiation, in Japanese Unexamined Patent Application, First Publication No. H1-87777 (patent document 3).

However, the method which is disclosed in Japanese Unexamined Patent Application, First Publication No. H1-87777, has the following problems.

Firstly, although the hydrogen alpha rays have a relatively large intensity, the hydrogen beta rays have a small intensity, and the hydrogen beta ray vary greatly. Therefore, when the ratio between the intensity of the hydrogen beta rays and the intensity of the radiation of other atomic specimen (molecular specimen) is calculated, the calculated ratio varies greatly; thus, it is difficult to know the inner structure of the plasma accurately.

Also, even if the ratio of the intensities is calculated between relatively intense rays such as the hydrogen alpha rays and the helium radiation, both the intensity of the hydrogen alpha rays and the intensity of the helium radiation fluctuate similarly if the thin film forming pressure fluctuates. Therefore, even if the thin film forming pressure fluctuates and the surface quality of the produced thin film fluctuates accordingly, the ratio between the intensity of the hydrogen alpha rays and the intensity of the helium radiation does not vary greatly. Therefore, there is a problem in that it is not possible to monitor the plasma accurately.

Also, the spectrum of the plasma is measured in a wide range from a visible wavelength to a near-visible wavelength (see FIG. 3 in patent document 3). There is a problem because a specific complicated spectrometer is necessary for such a measurement, and such a spectrometer is expensive.

Patent Document 3: Japanese Unexamined Patent Application, First Publication No. H1-87777.

DISCLOSURE OF INVENTION

The present invention was conceived in view of the above circumstances, and an object thereof is to provide a thin film forming method and a thin film forming device, which can achieve a stable gas impermeability and a desirable flexibility in a thin film without variation in surface quality even if the thin film is formed onto a large number of substrates.

Another object thereof is to provide a thin film forming process monitoring method, and a thin film forming device, by which it is possible to know the structure of a generated plasma more accurately, and to know whether or not the produced thin film has a desirable surface quality during the process in which a mixture gas consisting of an organosilicon compound gas and an oxidizing gas is plasmatized, and a silicon oxide thin film is formed on a surface of the substrate.

In the present invention, a thin film forming method for plasmatizing a mixture gas which consists of a monomer gas and an oxidizing reactive gas, and forming a thin film which is made of an oxide, on a surface of a substrate, includes: a first step of forming a first thin film by plasmatizing the mixture gas while varying the flow amount ratio of the monomer gas with respect to the reactive gas under the condition that the flow amount ratio is in at least a specific range.

In the first thin film forming step, it is preferable to decrease the supply flow amount ratio continuously.

In the first thin film forming step, it is preferable that an initial value of the supply flow amount ratio in the first thin film forming step be in a range of 0.02 to 0.2.

It is preferable that the thin film forming method further includes a second thin film forming step in which the supply flow amount ratio increases after the first thin film forming step.

Also, in the thin film forming method, it is preferable that the plasmatization be conducted while generated reflected power is controlled so as to be equal to 10% or less than a supplied high frequency power by passing the high frequency power which is 100 MHz or lower through a impedance matching network before being supplied to a high frequency electrode.

In the present invention, the thin film forming device for plasmatizing a mixture gas which consists of a monomer gas and an oxidizing reactive gas, and for forming a thin film which is made of an oxide, on an inner surface of a cylindrical container having a closed end, includes: a plurality of thin film forming chambers, each of the thin film forming chambers being provided with a cylindrical high frequency electrode, one end of the high frequency electrode being closed such that the cylindrical container can be disposed on the inner surface of the high frequency electrode, and a ground electrode disposed in the cylindrical container, the ground electrode having a gas generating port on a tip section of the ground electrode such that the gas generating port generates the mixture gas; a high frequency power supply section having an impedance matching network and a high frequency power supply such that high frequency power can be supplied to the high frequency electrode through the impedance matching network; and a flow amount control section for controlling the flow amount ratio of the monomer gas and the reactive gas contained in the mixture gas. In this case, the high frequency power is supplied to a plurality of the thin film forming chambers from a high frequency power supply section.

It is acceptable if a detachable spacer which is formed by an insulative member is disposed between the cylindrical container and the high frequency electrode.

It is preferable that the gas generating port have at least a hole of which the diameter is 0.5 mm or smaller and/or a slit of which the width is 0.5 mm or narrower.

Also, it is preferable that an average surface roughness of the outer surface of the ground electrode be 5 to 50 μm, or that a detachable cover pipe be provided on at least a part of the outer periphery of the ground electrode and that an average surface roughness of the outer surface of the cover pipe be 5 to 50 μm.

Also, it is preferable that a metal member or a ceramic member be sprayed onto the outer surface which has the average surface roughness.

Also, in the present invention, a thin film forming process monitoring method for plasmatizing a mixture gas consisting of an organosilicon compound gas and an oxidizing gas, and for forming a silicon oxide thin film on a surface of a substrate includes the steps of: measuring the intensity of hydrogen alpha rays which are radiated from the plasma and the intensity of an oxygen radiation rays; comparing the intensity of the hydrogen alpha rays and the intensity of the oxygen radiation rays with the intensity of the hydrogen alpha rays and the intensity of the oxygen radiation rays which have been measured under the condition that the silicon oxide thin film has a desirable surface quality; and determining whether or not the silicon oxide thin film which has a desirable surface quality is formed.

Here, it is preferable that the intensity of the hydrogen alpha rays and the intensity of the oxygen radiation rays be measured by separating radiation rays which have a specific range of wavelengths among radiation rays which are radiated from the plasma and measuring the intensity thereof.

Also, it is preferable that the intensity of the hydrogen alpha rays and the intensity of the oxygen radiation rays be measured by measuring the intensity of radiation rays which have a wavelength in the range of 656±5 nm and the intensity of radiation rays which have a wavelength range of 777±5 nm among the radiation rays which are radiated from the plasma.

Also, in the present invention, the thin film forming device includes: a chamber for plasmatizing a mixture gas, the mixture gas which consists of an organosilicon compound gas and an oxidizing gas, and for forming a silicon oxide thin film on a surface of a substrate; a measuring section for measuring the intensity of hydrogen alpha rays and the intensity of oxygen radiation rays, both of the rays being radiated from the plasma in the chamber; a storage section for storing the intensity of the hydrogen alpha rays and the intensity of the oxygen radiation rays such that the organosilicon thin film has a predetermined desirable surface quality; and a determining section for determining whether or not the intensity of the measured hydrogen alpha rays and the intensity of the measured oxygen radiation rays are within specific ranges, by comparing the intensity of the measured hydrogen alpha rays with the intensity of the hydrogen alpha rays in the storage section, and by comparing the intensity of the oxygen radiation rays measured by the measuring section with the intensity of the oxygen radiation rays which is stored in the storage section.

Here, it is preferable that the measuring section be provided with a bandpass filter which separate only radiation rays which have a specific wavelength range from among the radiation rays which are radiated from the plasma in the chamber.

Also, it is preferable that the measuring section include a first bandpass filter of which the transmittance of the radiation rays which have a wavelength range outside 656±5 nm is 1% or lower, a second bandpass filter of which transmittance of the radiation rays which have a wavelength range outside 777±5 nm is 1% or lower, a first quantity sensor which receives the radiation rays which pass through the first bandpass filter, and a second quantity sensor which receives the radiation rays which pass through the second bandpass filter.

BEST MODE FOR CARRYING OUT THE INVENTION

First Embodiment

Details of a first embodiment of the thin film forming method according to the present invention are explained with respect to the examples below, in which a thin film made of silicon oxide is formed on the inner surface of a plastic cylindrical container, which has a circular cross section with a closed end.

Figure 1:
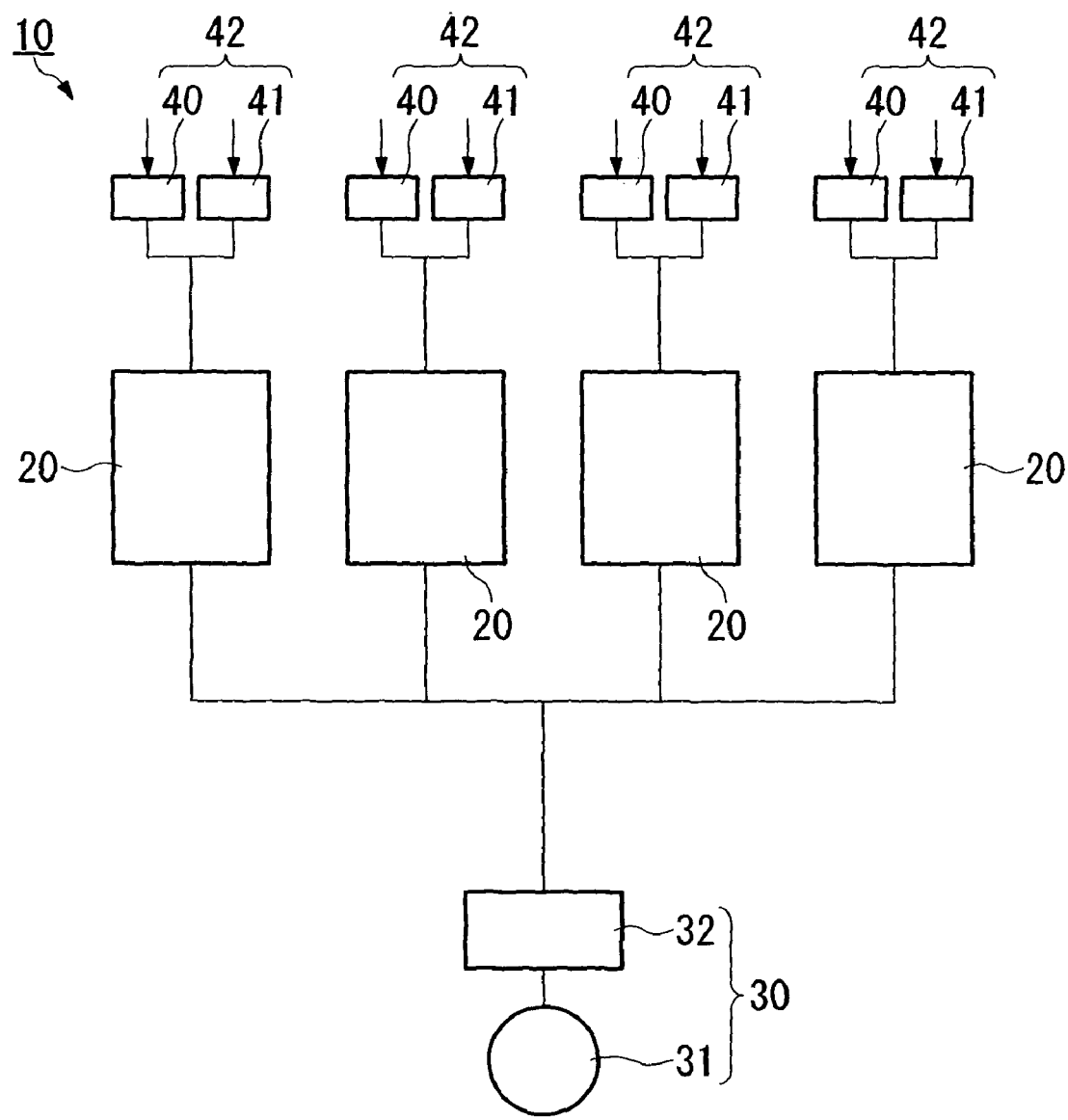
FIG. 1 is a general view of an example of a first embodiment of a thin film forming device.

FIG. 1 shows an example of a thin film forming device 10 which is preferably used in the present embodiment of the thin film forming method. The thin film forming device 10 is provided with four sets of thin film forming chambers 20 which enables forming of thin films in the four sets of cylindrical containers 21 simultaneously by disposing the cylindrical containers 21 in predetermined positions in the thin film forming chambers 20.

Figure 2:
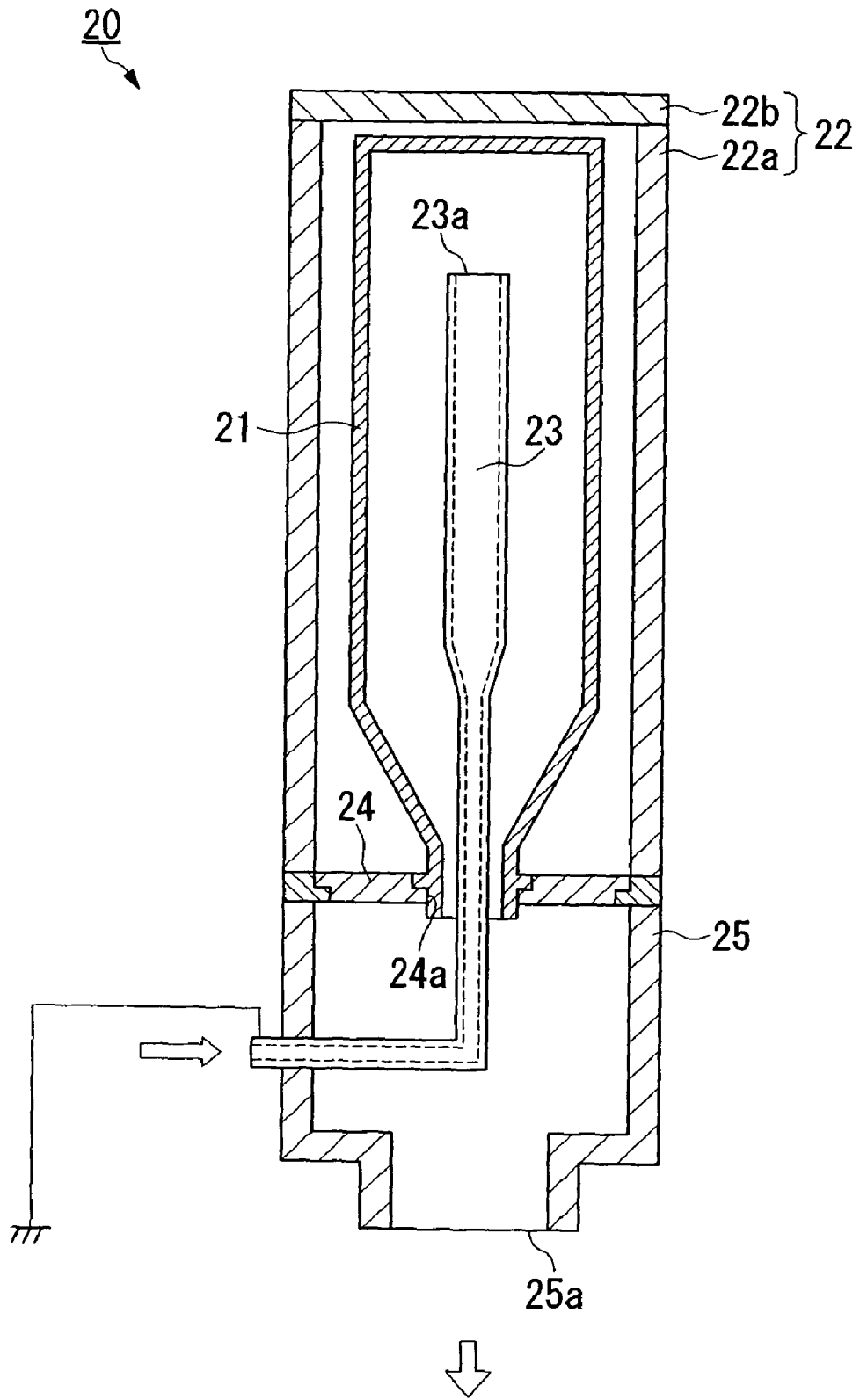
FIG. 2 is a vertical cross section of a thin film forming chamber which is provided in the thin film forming device shown in FIG. 1.

As shown in FIG. 2, each of the thin film forming chambers 20 is provided with a cylindrical high frequency electrode 22 having a circular cross section and a closed end, and a tubular ground electrode 23 of which the tip section is introduced inside of the cylindrical container 21 when the cylindrical container 21 is disposed in the predetermined position inside the high frequency electrode 22.

In this example, the high frequency electrode 22 consists of a cylinder section 22a which is formed from a conductive material, and a lid section 22b, which is formed from a conductive material and which seals an end of the cylinder section 22a. The lid section 22b is detachable from the cylinder section 22a.

Figure 3:
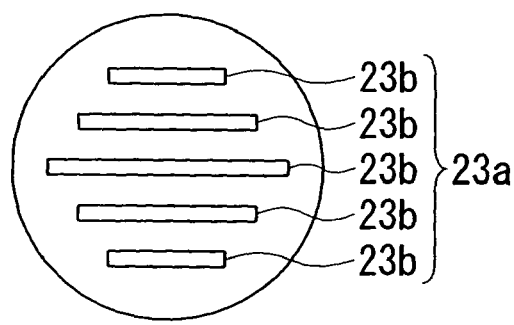
FIG. 3 is a plan view in which a gas generating port is formed in a ground electrode on the thin film forming device shown in FIG. 1.

Also, the ground electrode 23 is formed from a conductive material. A gas generating port 23a is formed on the tip section of the ground electrode 23 in order to generate a process gas, such as a mixture gas including a monomer gas and an oxidizing reactor, for forming silicon oxide toward the inside of the cylindrical container 21. The mixture gas is generated from the gas generating port 23a by introducing the monomer gas and the reactive gas from the base end section. As explained above, in this example, the ground electrode 23 serves as a gas introducing pipe for the process gas. Also, in this example, as shown in FIG. 3, the gas generating port 23a consists of five approximately rectangular slits 23b having a 0.5 mm width.

A port section supporting port 24a for supporting a port section of the cylindrical container 21, and an insulating plate 24 formed from a ceramic material for insulating the high frequency electrode 22, are formed on the other end of the high frequency electrode 22. Also, a cylindrical bottom section 25, which has a gas exhausting port 25a for exhausting air into the thin film forming chamber 20, is provided through this insulating plate 24. By connecting a suction pump, which is not shown in the drawing, to the gas exhausting port 25a, etc., it is possible to depressurize the inside of the thin film forming chamber 20 and evacuate air therewithin. Here, a connection hole (not shown in the drawing) which can connect a space between the cylindrical container 21 and the high frequency electrode 22 and a space inside of the cylindrical container 21 is formed in the insulating plate 24. When the suction pump starts, it is possible to depressurize not only the space inside the cylindrical container 21 but also the space between the cylindrical container 21 and the high frequency electrode 22. Here, the tip of the above explained ground electrode 23 is introduced to the inside of the cylindrical container 21 through the bottom section 25.

In FIG. 1, reference numeral 42 indicates four sets of flow amount control sections, each of which consists of a mass-flow controller 40 for controlling the flow amount of the reactive gas and a mass-flow controller 41 for controlling the flow amount of the monomer gas. The mass-flow controllers 40 and 41 are provided in each of the thin film forming chambers 20. The flow amount of the reactive gas and the flow amount of the monomer gas are controlled by the flow amount control sections 42. After that, the reactive gas and the monomer gas are introduced into each of the thin film forming chambers 20 from the base end section of the ground electrode 23. By doing this, the reactive gas and the monomer gas are generated from the gas generating port 23a.

In addition, as shown in FIG. 1, the thin film forming device 10 is provided with a high frequency power supply section 30 which can supply high frequency power to the four sets of the thin film forming chambers 20 simultaneously.

The high frequency power supply section 30 is provided with a high frequency power supply 31 for supplying high frequency power, and an impedance matching network 32 for rectifying the high frequency power supplied from the high frequency power supply 31. The high frequency power supplied from the high frequency power supply 31 is adjusted while controlling a matching value, and supplied to the high frequency electrode 22. By doing this, it is possible to avoid a reflected power; thus, the supplied high frequency power is sent to the high frequency electrode 22 efficiently. As a result, it is possible to form a thin film which has a desirable gas impermeability.

Next, an example of a method by which the thin films are formed on the four sets of the cylindrical containers 21 by the thin film forming device 10 in this example, is explained.

Firstly, the lid section 22b of the high frequency electrode 22 is removed in each of the thin film forming chambers 20. The cylindrical container 21, as a substrate, is put into the high frequency electrode 22. The port section of the cylindrical container 21 is fitted to the port section supporting port 24a formed on the insulating plate 24. Next, the lid section 22b is fitted to the cylindrical section 22a of the high frequency electrode 22 so as to form a seal. Thus, the end of the high frequency electrode 22 is sealed. The gas generating port 23a, which is formed on the tip of the ground electrode 23, is disposed inside of the cylindrical container 21. After that, a suction pump, which is not shown in the drawing, is started. After air in the space inside of the thin film forming chamber 20 is depressurized until it is completely evacuated, a mixture gas, which consists of a monomer gas and a reactive gas, is introduced into the thin film forming chambers 20 while controlling the flow amount of the monomer gas and the flow amount of the reactive gas by means of the flow amount control sections 42. By doing this, the mixture gas is generated from the gas generating port 23a. Next, the high frequency power supply section 30 is started. high frequency power, which is not greater than 100 MHz, is transmitted through the impedance matching network 32. The high frequency power is supplied to the high frequency electrode 22 in each of the thin film forming chambers 20 while varying the matching value, and controlling the generated reflected power to under 10% of the supplied high frequency power. As a result, the mixture gas is plasmatized between the high frequency electrode 22 and the ground electrode 23 in each of the thin film forming chambers 20; thus, a thin film, which is formed of silicon oxide is formed on the inner surface of the cylindrical container 21.

In addition, in a first thin film forming step, a flow rate decreases continuously and gradually from a large flow rate while a flow rate (supply flow amount ratio) of the monomer gas, with respect to the reactive gas in the supplied mixture gas is included within at least a specific range. By such a first thin film forming step, it is possible to stably form a thin film which has a particularly high gas impermeability without variation. The supply flow amount ratio is controlled by the flow amount control section 42.

In this example, the specific range indicates a range of a supply flow amount ratio, by which a thin film having a desirable gas impermeability can be formed. The specific range varies according to the type of the produced thin film, and the type of employed mixture gas. The specific range of the supply flow amount ratio of the monomer gas, with respect to the reactive gas, for forming a thin film having a desirable gas impermeability is in a range of 0 to approximately 0.05, if a thin film of an silicon oxide is formed under the condition that, if the mixture gas is formed from a monomer gas and a reactive gas, the monomer gas is an organosilicon compound such as hexamethyldisiloxane, and the reactive gas is oxygen.

Figure 4:
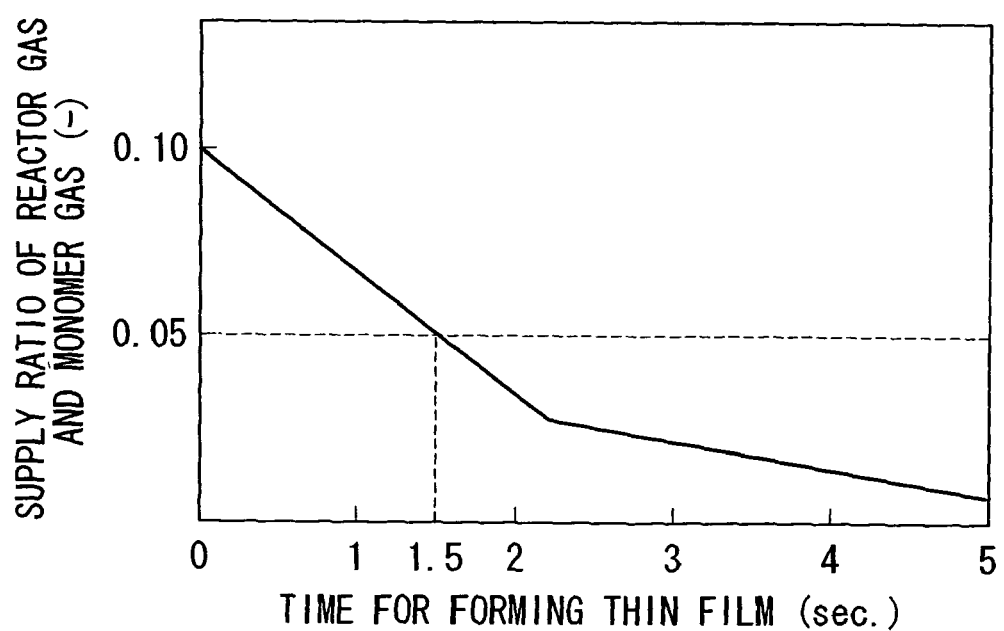
FIG. 4 is a graph which shows an example of the change of a supply flow amount ratio with respect to time.
Figure 5:
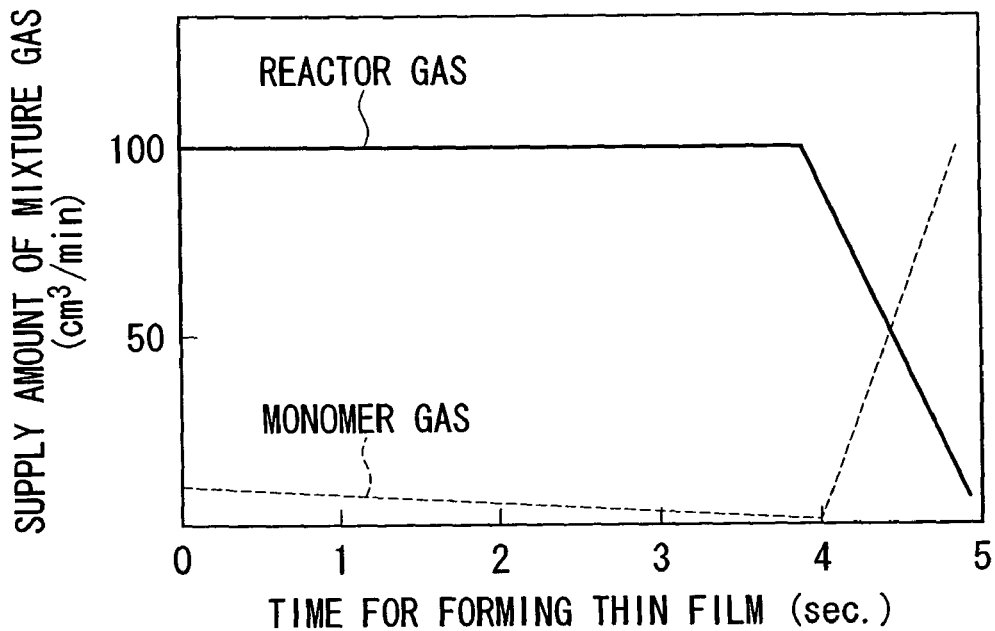
FIG. 5 is a graph which shows another example of the change of a supply flow amount ratio with respect to time.

Therefore, for example, as shown in the graph in FIG. 4, the initial value of the supply flow amount ratio in the first thin film forming step is set at 0.1, which is greater than the above specific range. After that, the mixture gas is supplied. After that, the high frequency power is supplied from the high frequency power supply section 30. The mixture gas is plasmatized between the high frequency electrode 22 and the ground electrode 23. Next, the supply flow amount ratio is decreased continuously by decreasing the flow amount of the monomer gas continuously by means of the flow amount control section 42 while the plasmatization of the mixture gas is maintained.

Consequently, the flow amount of the monomer gas is decreased for approximately 5 seconds until the supply flow amount ratio is 0.01. By doing this, the supply flow amount ratio decreases continuously from 0.1 to 0.01 in approximately 5 seconds. Thus, there is a time period of 3.5 seconds in which the supply flow amount ratio is in a range of 0 to 0.05, in which it is possible to form a thin film having a desirable gas impermeability.

By a method in which the supply flow amount ratio is controlled variably and continuously such that the supply flow amount ratio is included within at least the specific range, it is possible to form a thin film having a desirable gas impermeability more easily than the case of strictly controlling the supply flow amount ratio, forming a thin film having a desirable gas impermeability, and plasmatizing the mixture gas while strictly maintaining the supply flow amount ratio strictly. Also, it is very difficult to control the supply flow amount ratio at a constant level every time the thin film is formed. However, by the above method, it is possible to form a thin film repeatedly without strictly controlling the flow amount strictly. Therefore, the quality of the produced thin films is consistent even if a large number of thin films are produced on the cylindrical container 21.

The specific range is variable in accordance with the type of the employed mixture gas and the purpose for forming the thin film. Therefore, there is no limitation for the specific range and it is possible to set the specific range desirably. Also, the time for controlling the supply flow amount ratio within the specific range is variable in accordance with the type of the employed mixture gas and the purpose for forming the thin film. Therefore, there is no limitation for the time and it is possible to set the time desirably. However, it is preferable to maintain the supply flow amount ratio for 2 to 5 seconds within the above specific range in order to use an organosilicon compound such as hexamethyldisiloxane as the monomer gas, and use oxygen as the reactive gas in order to form a thin film, which is formed from silicon oxide having a desirable gas impermeability. There is a case in which a thin film having a desirable gas impermeability cannot be produced, if the time is shorter than 2 seconds. If the time exceeds 5 seconds, the gas impermeability is not improve.

Also, in this example, as shown in FIG. 4, the supply flow amount ratio decreases continuously by two steps of different speed reductions. However, such a two-stepped speed reduction is not an absolute requirement. For example, a three, or more-stepped speed reduction is acceptable. Also, it is acceptable if the supply flow amount ratio decreases at a constant decreasing speed. Also, as long as the supply flow amount ratio varies while being included in at least the specific range, the supply flow amount ratio may increase in the first thin film forming step. Also, it is acceptable if the supply flow amount ratio varies while repeating the increase and the decrease alternately. However, like this example, in the method for decreasing the supply flow amount ratio continuously, a mixture gas having a high monomer gas density is plasmatized in the initial period of the first thin film forming step. Therefore, a more organic thin film is formed on a surface of the substrate. If the substrate is made of plastic, adhesion strength between the substrate and the thin film can be improved.

Also, in this example, the initial value of the supply flow amount ratio starts at 0.1 in the first thin film forming step, and after that, the supply flow amount ratio decreases. A preferable initial value for the supply flow amount ratio is 0.02 to 0.2. More preferably, it is 0.02 to 0.1. If the supply flow amount ratio is smaller than 0.01, the supply flow amount ratio probably cannot be included in the specific range; thus, it is not possible to form a thin film having a desirable gas impermeability. On the other hand, if the supply flow amount ratio exceeds 0.2, it will take an undesirably long time for forming a thin film.

Also, in this example, the supply flow amount ratio is variable while the reactive gas is supplied by an approximately constant flow amount, and only the supply flow amount of the monomer gas decreases. According to this method, it is possible to form a thin film having a desirable gas impermeability in a short time. In addition, the supply flow amount may be decreased by various other methods. For example, it is acceptable that the supply flow amount of the reactive gas increase while the supply flow amount of the monomer gas is approximately constant. Also, it is acceptable that both the supply flow amount of the monomer gas and the supply flow amount of the reactive gas vary while the supply flow amount of the mixture gas is approximately constant. An optimum value for the total supply flow amount of the mixture gas varies in accordance with the capacity (exhausting speed) of the suction pump; therefore, it is preferable to set the total supply flow amount in accordance with the capacity of the suction pump.

Also, as explained above, in this example, the mixture gas is plasmatized while the generated reflected power is controlled to be 10% or lower of the supplied high frequency power 100 MHz or lower high frequency power through the impedance matching network 32 and supplying the high frequency power to the high frequency electrode 22 while varying the matching value. Therefore, even if the impedance of the plasma varies because the supply flow amount ratio varies in the first thin film forming step, it is possible to maintain a substantially high frequency power for plasmatizing the mixture gas at an approximately constant level, and avoid the reduced gas impermeability of the thin film due to an increase of the reflected power. If the reflected power is maintained at 10% or lower, the gas impermeability of the produced thin film can be maintained at a higher level.

Also, like in this example, in the case of forming a thin film made of a silicon oxide, in a second thin film forming step, it is preferable that the supply flow amount ratio of the monomer gas with respect to the reactive gas increase after the above-explained first thin film forming step. By means of the second thin film forming step, it is possible to form an organic film on the outside of the thin film formed in the first thin film forming step. As a result, it is possible to form a thin film which has not only gas impermeability, but also flexibility. Thus, cracks hardly occur during use of the cylindrical container 21.

In order to increase the supply flow amount ratio of the monomer gas with respect to the reactive gas, a method in which only the supply flow amount of the monomer gas increases is available. Also, a method in which only the supply flow amount of the reactive gas decreases is available. In addition, a method is preferable in which the total supply flow amount of the mixture gas is maintained approximately constant without a large variance, the supply flow amount of the monomer gas increases, and the total supply flow amount of the reactive gas decreases simultaneously. By doing this, a more flexible thin film can be produced.

Also, like in this example, in order to form a flexible silicon oxide thin film having a high gas impermeability, it is preferable that the supply flow amount ratio of the monomer gas with respect to the reactive gas be 100 or greater in the end. It is more preferable if it is 1000 or greater. Furthermore, it is preferable if the flow amount of the reactive gas in the mixture gas is zero. Also, in such a case, it is preferable that the time necessary for the second thin film forming step be in a range of 1 to 3 seconds.

The thin film forming method explained above includes a first thin film forming step for plasmatizing the mixture gas while the supply flow amount ratio varies continuously such that the supply flow amount ratio is included in at least the specific range. Therefore, it is possible to form a thin film having a desirable gas impermeability easily while avoiding variation in surface quality on the produced thin film, in comparison with a method in which the supply flow amount ratio is controlled strictly such that a thin film has a desirable gas impermeability, and the mixture gas is plasmatized, while the supply flow amount ratio is maintained strictly. In addition, it is possible to form a thin film having not only gas impermeability but also flexibility, in the above second thin film forming step, after this first thin film forming step.

Also, even if a thin film is formed on a large number of the cylindrical containers 21, it is possible to form a thin film having a high gas impermeability stably while avoiding variations in surface quality among the containers, particularly by using the thin film forming device 10 which is shown in the drawings and which can supply high frequency power from a high frequency power supply section 30 to a plurality of thin film forming chambers 20. In addition, the thin film forming device 10 can be a compact structure. Therefore, the thin film forming device 10 is preferable in view of having low facility cost.

Figure 6:
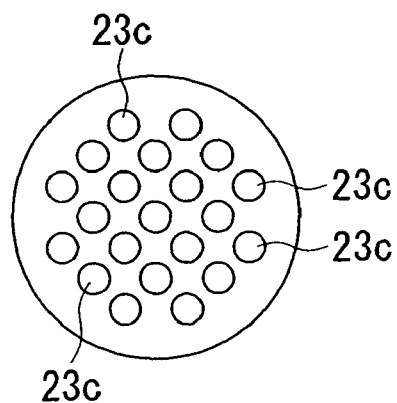
FIG. 6 is a plan view in which another example of the gas generating port is formed in the ground electrode on the thin film forming device.

Five slits 23b, each of which has a 0.5 mm width, are formed in the width direction of the gas generating port 23a. Here, as shown in the drawings, the gas generation port 23a is formed on the tip of the ground electrode 23 in the thin film forming device 10. However, there are not limitations for the number of the slits, the width of the slits, and the interval between the slits. Furthermore, there is no limitation for the shape. That is, an oval shape, etc., is acceptable. However, the pressure difference between the inside and an outside of the ground electrode 23 increases if the gas generating port 23a is formed by slits each of which has a 0.5 mm width or narrower, or if the gas generating port 23c is formed by at least a hole 23c having a 0.5 mm or smaller diameter as shown in FIG. 6. In these cases, the mixture gas is plasmatized in a limited manner. As a result, the thickness of the thin film is not different between the vicinity section near the gas generating port 23a on an inner surface of the cylindrical container 21, and the rest of the section. Thus, the thin film is formed uniformly.

Also, it is preferable that an average surface roughness (Ra) of the outer surface of the ground electrode 23 be in a range of 5 to 50 μm. That is, when a mixture gas is generated in the gas generating port 23a formed in the ground electrode 23 and the mixture gas is plasmatized, a thin film is formed not only on the inner surface of the cylindrical container 21, but also the outer surface of the ground electrode 23. Here, if the average surface roughness (Ra) of the outer surface of the ground electrode 23 is roughened in a range of 5 to 50 μm contact between the thin film and the outer surface increases, even if the thin film is formed on this outer surface. Also, there is a repetition of expansion and contraction on the ground electrode 23 due to heat. As a result, there is an effect that stress is reduced even if stress is applied to the thin film. Therefore, it is possible to restrict contamination in the cylindrical container 21 due to peeling off of the silicon oxide thin film from the outer surface of the ground electrode 23 while using the thin film forming device 10. Here, if the average surface roughness is 5 μm or lower, the roughness is insufficient. Therefore, it is not possible to restrict the peeling of the thin film desirably. On the other hand, an abnormal electric discharge may sometimes occur in a region having an excessive roughness over 50 μm. In such a case, a thin film cannot be formed stably.

Figure 7:
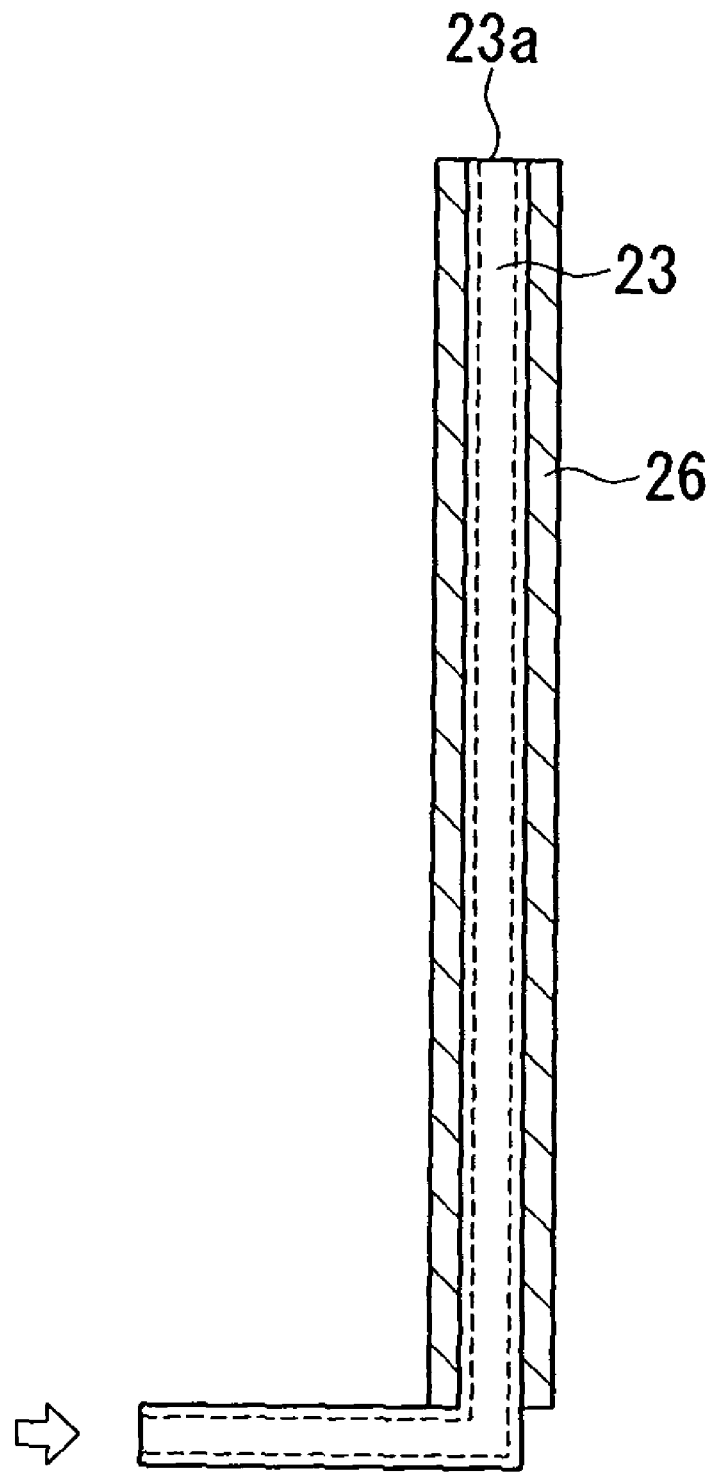
FIG. 7 is a vertical cross section in which an example of the ground electrode which is provided with the thin film forming device is shown.

Also, even if the outer surface of the ground electrode 23 is roughened in this manner, it is necessary to remove the thin film formed on the ground electrode 23 periodically if the thin film has a certain degree of thickness. Therefore, it is more preferable that, a detachable cover pipe 26 of which the outer surface has 5 to 50 μm of average surface roughness (Ra) be disposed on the outer periphery of the ground electrode 23, as shown in FIG. 7, in order to replace a currently-disposed cover pipe 26 by a new cover pipe 26 when the outer surface of the currently-disposed cover pipe 26 has a certain degree of thickness of the thin film. By doing this, it is possible to continue the operation of the thin film forming device because the cover pipe 26 can be replaced by a new cover pipe simply and quickly, even if a certain degree of thickness of the thin film is formed on the outer surface of the cover pipe 26. Therefore, there is a superior maintenance ability.

There is no limitation for the method of regulating the average surface roughness in the above range. For example, it is possible to name a sand blast method or a chemical etching method. Alternatively, it is possible to control the average surface roughness by spraying the metal or ceramics on the outer surface of the ground electrode 23, or on the outer surface of the cover pipe 26. The surface of the sprayed material made of metal or ceramics is not only roughened but also porous thereinside. Therefore, the sprayed material has superior contact to with respect to the thin film. Thus, it is possible to prevent the thin film from being removed, or peeling from the outer surface of the ground electrode 23, and the outer surface of the cover pipe 26.

Figure 8:
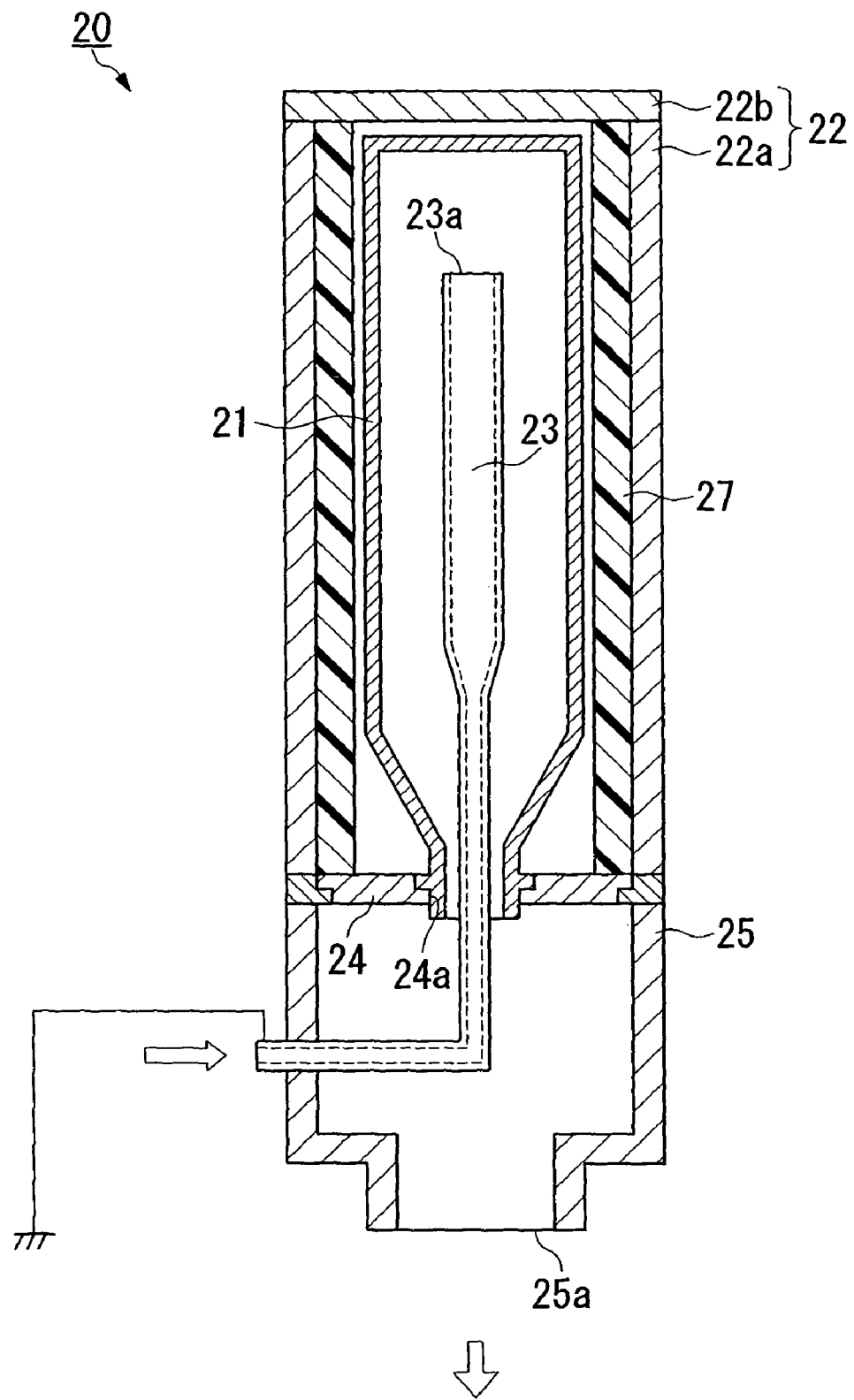
FIG. 8 is a plan view in which another example of the thin film forming chamber is shown.

Also, in the thin film forming chamber in the thin film forming device 10, as shown in FIG. 8, a cylindrical insulative spacer 27 may be disposed detachably between the cylindrical container 21 and the high frequency electrode 22, while the cylindrical container 21 is disposed inside of the high frequency electrode 22. By doing this, it is possible to form a thin film on various cylindrical containers 21 having various sizes and outer shapes.

That is, if a thin film is formed on the surface of a cylindrical container 21 having a small diameter, a relatively thick cylindrical spacer 27 is used. As a result, the volume of the space between the cylindrical container 21 and the high frequency electrode 22 is reduced; thus, it is possible to evacuate the space in the thin film forming chamber 20 quickly. Also, even if the spacer 27 is used, the cylindrical container 21 is positioned coaxially with the high frequency electrode 22; therefore, the thickness of the produced thin film is uniform. Also, if the cross section of the cylindrical container 21 has a non-circular shape, such as an oval or a rectangular shape, it is possible to form a thin film having a desirable gas impermeability with a uniform thickness on any type of the cylindrical containers 21 by using the spacer 27 of which the cross section of the inner surface has an outer shape which is similar to the cylindrical container 21.

Also, in such a case, it is possible to form a thin film on the inner surface of the cylindrical container 21 efficiently by disposing the spacer 27 so as to contact the inner surface of the high frequency electrode 22.

Furthermore, as explained above, it is possible to form a thin film stably on various cylindrical containers 21 having different sizes and different outer shapes by using the spacer 27. Also, it is possible to restrict contamination in the mixture gas on an inner surface of the high frequency electrode 22. If the inner surface of the high frequency electrode 22 is contaminated, the electricity discharge efficiency may sometimes decreases. Therefore, it is possible to prevent the electricity discharge efficiency from decreasing by using the spacer 27 in this manner. Thus, the surface quality of the thin film is stable for a long time.

It is possible to name plastics and ceramics as the material for forming the spacer 27 because they do not affect the electricity discharge efficiency in the high frequency electrode 22, even if its inner surface is contaminated. In particular, it is possible to name plastics because of their formability.

As explained above, the thin film forming method includes the first thin film forming step in which the mixture gas is plasmatized while the supply flow amount ratio varies continuously, such that the supply flow amount ratio is included in at least the specific range. Therefore, in comparison with a method in which the supply flow amount ratio is strictly controlled in a range, it is possible to easily form a thin film having a desirable gas impermeability without an uneven surface quality of the thin film. Also, it is unlikely that variations in surface quality will occur when the thin films are formed on a large number of the substrates. Furthermore, in the above second thin film forming step, it is possible to form a thin film having not only gas impermeability but also flexibility after the first thin film forming step.

Also, as shown in the drawings, a certain type of the thin film forming device 10, which can supply high frequency power from a high frequency power supply section 30 to a plurality of thin film forming chambers 20, may be used. By doing this, even if the thin film is formed on a large number of substrates, it is possible to form a thin film which has a high gas impermeability, more stably and productively, without variations in surface quality among the containers. In addition, the thin film forming device 10 has a compact structure. Therefore, the thin film forming device 10 is preferable in view of a low facility costs.

In the above explained thin film forming method, the plastic cylindrical container 21 is shown as an example of the substrate. There is no limitation for the material for forming the substrate. Glass is acceptable as the material for forming the substrate as long as a thin film, which can realize predetermined functions stably, can be formed thereon. Also, in view of the shape, the substrate is not limited to a container.

In addition, although the above explanations are made for the case in which the mixture gas includes the monomer gas and the reactive gas, the mixture gas may include an inert gas such as helium, argon, etc. Also, regarding the monomer gas which is used for forming the thin film which is formed of silicon oxide, it is possible to select it from among hexamethyldisiloxane, 1,1,3,3-tetramethyldisiloxane, vinyltrimethylsilane, methyltrimethoxysilane, hexamethyldisilane, methylsilane, dimethylsilane, trimethylsilane, diethylsilane, propylsilane, phenylsilane, vinyltriethoxysilane, vinyl trimethoxysilane, tetramethoxysilane, tetraethoxysilane, phenyltrimethoxysilane, methyl triethoxysilane, and octamethylcyclotetrasiloxane. In particular, 1,1,3,3-tetramethyldisiloxane, hexamethyldisiloxane, and octamethylcyclotetrasiloxane are preferable. However, it is also possible to use aminosilane and silazane.

Also, it is possible to form an alumina thin film by using an organic metal aluminum such as trimethylaluminum as a monomer gas.

Also, it is possible to use not only oxygen but also nitrous oxide, carbon dioxide, and ozone, as the oxidizing reactive gas.

EXPERIMENTAL EXAMPLE

Hereinafter, the present invention is explained specifically in detail with respect to Experimental Examples.

Experimental Example 1

A cylindrical container 21, which is made of polyethyleneterephthalate and has a circular cross section and a 500 ml capacity, is disposed in a thin film forming chamber 20. The space in the thin film forming chamber 20 is evacuated (initial pressure for forming a thin film: 10 Pa). After that, the flow amount of hexamethyldisiloxane (monomer gas) and the flow amount of oxygen (reactive gas) are controlled by a mass-flow controller. The monomer gas and the reactive gas are supplied from the base end of the ground electrode 23 (gas introducing pipe). The initial supply flow amount of hexamethyldisiloxane is 10 ml/min. The initial supply flow amount of oxygen is 500 ml/min (that is, the initial supply flow amount ratio=0.02). Also, as shown in FIG. 3, the ground electrode 23, which has the gas generating port 23a at the tip section of the ground electrode 23, and consists of five approximately rectangular slits 23b with a 0.5 mm width, is prepared. Also, as shown in FIG. 7, the copper cover pipe 26 having an average surface roughness (Ra) of 10 μm, which is finished by a sand-blast treatment, is disposed on the outer periphery of the ground electrode 23.

Next, 13.56 MHz high frequency power is supplied to the high frequency electrode 22 in the thin film forming chamber 20 for 5 seconds, by supplying 400 watts of electricity. By doing this, a thin film is formed. During this period, the supply flow amount ratio of hexamethyldisiloxane with respect to an oxygen varies continuously as shown in TABLE 1.

As a result, a silicon oxide thin film is formed uniformly on the inner surface of the cylindrical container 21. Furthermore, the above operation is repeated. Thus, the thin film is formed on 30 cylindrical containers 21 in total. The permeability of the oxygen is measured in each of these containers 21; thus, its average value and its standard deviation are calculated. As a result, as shown in TABLE 2, it is clarified that it is possible to form a thin film in which every average value and every standard deviation of the permeability of oxygen are small, the oxygen impermeability is high, and the surface quality does not vary. Here, the oxygen permeability is measured by Mocon Inc.'s Oxitran 10/50. Here, in the space inside of the cylindrical container 21, the temperature is 25° C. in a 90% nitrogen/hydrogen mixture gas atmosphere. The outside space of the cylindrical container is 25° C. temperature in a 65% atmospheric condition.

In addition, although the thin film is formed by the above method thousands of times, the produced thin film never peels off from the outer surface of the cover pipe 26.

Experimental Examples 2 to 10

A silicon oxide thin film is formed on an inner surface of the cylindrical container 21 in a manner similar to that of Experimental Example 1, except that the initial supply flow amount of hexamethyldisiloxane (monomer gas) and the initial supply flow amount of oxygen (reactive gas) are set as shown in TABLE 1, and the supply flow amount ratio varies in accordance with TABLE 1. Furthermore, the above operation is repeated in each of the Experimental Examples. Thus, the thin film is formed on 30 cylindrical containers 21 in total. The permeability of the oxygen is measured in each of these containers 21; thus, its average value and its standard deviation are calculated. As a result, as shown in TABLE 2, it is clarified that it is possible to form a thin film in which every average value and every standard deviation of the permeability of oxygen are small, an oxygen impermeability is high, and the surface quality does not vary.

Also, the internal pressure in the containers 21, which are used in the Experimental Examples 5 and 9, is maintained at 7 kg/cm$^2$ for 2 hours, and after that the oxygen permeability is measured in order to evaluate the flexibility of the thin film formed on the cylindrical containers 21. As a result, the oxygen permeabilities are 0.028 fmol/s·Pa and 0.023 fmol/s·Pa, respectively. In the Experimental Example 9, in which the second thin film forming step is conducted after the first thin film forming step, the oxygen permeability does not vary before and after the space inside of the cylindrical container 21 is pressurized. The oxygen permeability increases slightly in Experimental Example 5 in which the second thin film forming step is omitted. This is because the produced thin film has a sufficient flexibility because of the second thin film forming step. By doing this, cracks are not generated because the thin film adjustably varies its shape even if the cylindrical container 21 is deformed slightly; thus, the oxygen impermeability is maintained desirably.

Experimental Example 11

As shown in FIG. 1, thin films are produced on four sets of polyethylene terephthalate cylindrical containers 21 simultaneously, which have circular cross sections. In order to do this, four sets of thin film forming chambers 20, and thin film forming device 10, which is provided with the high frequency power supply section 30 for supplying high frequency power to each high frequency electrode 22, are used. In each of the thin film forming chambers 20, the same ground electrode 23 as used in Experimental Example 1 is used.

The initial supply flow amount of hexamethyldisiloxane as the monomer gas is 10 ml/min in each of the thin film forming chambers 20. The initial supply flow amount of oxygen as the reactive gas is 500 ml/min in each of the thin film forming chambers 20 (that is, the initial supply flow amount ratio=0.02). After that, the supply flow amount ratio of the hexamethyldisiloxane with respect to the oxygen varies as shown in TABLE 1.

Also, the initial pressure for forming a thin film is 10 Pa. The supplied high frequency power (charged electricity) is 400 watts in each of the thin film forming chambers 20 (1600 watts in total). A thin film is formed by supplying 13.56 MHz of high frequency power for 5 seconds. Here, the matching value varies during supply of the high frequency power. Also, the reflected power is controlled so as to be at 160 watts constantly, which is 10% or lower of the supplied electricity.

In addition, the above operation is repeated. The thin film is formed on 30 cylindrical containers 21 in total; thus, the thin film is formed on 120 cylindrical containers 21 in the thin film forming device 10 in total. Furthermore, the permeability of the oxygen is measured in each of these containers 21; thus, its average value and its standard deviation are calculated. As a result, as shown in TABLE 2, it is evident that it is possible to form a thin film in which every average value and every standard deviation of the permeability of oxygen are small, the oxygen impermeability is high, and the surface quality does not vary.

Comparative Examples 1 to 8

A thin film is formed in a manner similar to that of Experimental Example 1 except that the supply flow amount ratio is constant as shown in TABLE 1. The oxygen impermeability is measured in the 30 produced cylindrical containers 21 in total. The results are shown in TABLE 1 similar to Experimental Example 1.

TABLE 2

| | Oxygen Permeability (fmol/s · Pa) | |
|---|---|---|
| | Average Value | Standard Deviation |
| Embodiment 1 | 0.015 | 0.0014 |
| Embodiment 2 | 0.018 | 0.0015 |
| Embodiment 3 | 0.030 | 0.0017 |
| Embodiment 4 | 0.010 | 0.0011 |
| Embodiment 5 | 0.021 | 0.0015 |
| Embodiment 6 | 0.039 | 0.0016 |
| Embodiment 7 | 0.022 | 0.0013 |
| Embodiment 8 | 0.040 | 0.0017 |
| Embodiment 9 | 0.024 | 0.0018 |
| Embodiment 10 | 0.045 | 0.0021 |
| Embodiment 11 | 0.016 | 0.0015 |
| Comparative Example 1 | 0.125 | 0.0098 |
| Comparative Example 2 | 0.088 | 0.0075 |
| Comparative Example 3 | 0.076 | 0.0068 |
| Comparative Example 4 | 0.064 | 0.0045 |
| Comparative Example 5 | 0.040 | 0.0041 |
| Comparative Example 6 | 0.056 | 0.0056 |
| Comparative Example 7 | 0.126 | 0.0112 |
| Comparative Example 8 | 0.240 | 0.0125 |

TABLE 1

| | Supply Flow Amount [cm³/min] | | | | | | | | | | | |
|---|---|---|---|---|---|---|---|---|---|---|---|---|
| | Initial Value (0 sec) | | After 1 sec | | After 2 sec | | After 3 sec | | After 4 sec | | After 5 sec | |
| | Monomer Gas | Reactive gas | Monomer Gas | Reactive gas | Monomer Gas | Reactive gas | Monomer Gas | Reactive gas | Monomer Gas | Reactive gas | Monomer Gas | Reactive gas |
| Embodiment 1 | 10 | 100 | 5 | 100 | 3 | 100 | 2 | 100 | 1 | 100 | 0 | 100 |
| Embodiment 2 | 20 | 100 | 10 | 100 | 6 | 100 | 4 | 100 | 2 | 100 | 0 | 100 |
| Embodiment 3 | 25 | 100 | 12.5 | 100 | 7.5 | 100 | 5 | 100 | 2.5 | 100 | 0 | 100 |
| Embodiment 4 | 5 | 100 | 2.5 | 100 | 1.5 | 100 | 1 | 100 | 0.5 | 100 | 0 | 100 |
| Embodiment 5 | 2 | 100 | 1 | 100 | 0.6 | 100 | 0.4 | 100 | 0.2 | 100 | 0 | 100 |
| Embodiment 6 | 1 | 100 | 0.5 | 100 | 0.3 | 100 | 0.2 | 100 | 0.1 | 100 | 0 | 100 |
| Embodiment 7 | 20 | 100 | 10 | 100 | 6 | 100 | 4 | 100 | 2 | 100 | 50 | 0 |
| Embodiment 8 | 25 | 100 | 12.5 | 100 | 7.5 | 100 | 5 | 100 | 2.5 | 100 | 50 | 0 |
| Embodiment 9 | 2 | 100 | 1 | 100 | 0.6 | 100 | 0.4 | 100 | 0.2 | 100 | 50 | 0 |
| Embodiment 10 | 1 | 100 | 0.5 | 100 | 0.3 | 100 | 0.2 | 100 | 0.1 | 100 | 50 | 0 |
| Embodiment 11 | 10 | 100 | 5 | 100 | 3 | 100 | 2 | 100 | 1 | 100 | 0 | 100 |
| Comparative Example 1 | 0.1 | 100 | 0.1 | 100 | 0.1 | 100 | 0.1 | 100 | 0.1 | 100 | 0.1 | 100 |
| Comparative Example 2 | 0.2 | 100 | 0.2 | 100 | 0.2 | 100 | 0.2 | 100 | 0.2 | 100 | 0.2 | 100 |
| Comparative Example 3 | 0.5 | 100 | 0.5 | 100 | 0.5 | 100 | 0.5 | 100 | 0.5 | 100 | 0.5 | 100 |
| Comparative Example 4 | 1 | 100 | 1 | 100 | 1 | 100 | 1 | 100 | 1 | 100 | 1 | 100 |
| Comparative Example 5 | 2 | 100 | 2 | 100 | 2 | 100 | 2 | 100 | 2 | 100 | 2 | 100 |
| Comparative Example 6 | 5 | 100 | 5 | 100 | 5 | 100 | 5 | 100 | 5 | 100 | 5 | 100 |
| Comparative Example 7 | 10 | 100 | 10 | 100 | 10 | 100 | 10 | 100 | 10 | 100 | 10 | 100 |
| Comparative Example 8 | 20 | 100 | 20 | 100 | 20 | 100 | 20 | 100 | 20 | 100 | 20 | 100 |

As clearly shown in TABLES 1 and 2, it is possible to form thin films having a desirable oxygen impermeability on many containers without variation in surface quality in the embodiments, in which the thin films are formed by the first thin film forming step for generating a plasma while decreasing the supply flow amount ratio of the monomer gas with respect to the reactive gas. In particular, it is found that in the embodiment in which the second thin film forming step is conducted after the first thin film forming step, the produced thin film has flexibility.

On the other hand, it is possible to form a thin film having a desirable gas impermeability in some of the comparative examples, in which the supply flow amount ratio of the monomer gas with respect to the reactive gas is controlled constantly. However, in many cases, a thin film having a desirable gas impermeability cannot be formed, and the surface quality of the produced thin films vary greatly.

A second embodiment of the present invention is explained as follows.

<Thin Film Forming Device>

Figure 9:
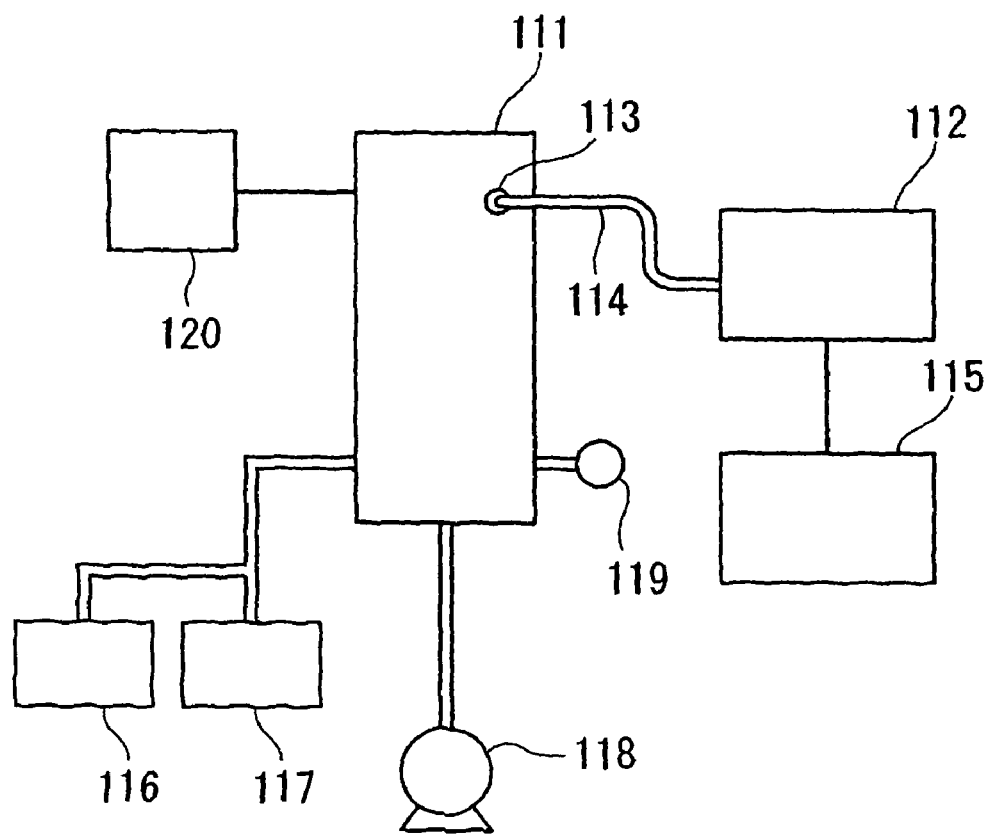
FIG. 9 is a general view of an example of the thin film forming device according to the present invention.

FIG. 9 is a general view showing an example of the thin film forming device according to the present invention. As a general structure, this thin film forming device includes a thin film forming chamber 111 in which a mixture gas including an organosilicon compound gas and an oxidizing gas is plasmatized so as to form a silicon oxide thin film (SiOx membrane) on a substrate, an optical spectrometer 112 (measuring section) for measuring the intensity of hydrogen alpha rays radiated from a plasma in the thin film forming chamber 111 and measuring an intensity of an oxygen radiation rays, an optical fiber 114 for transmitting radiation rays separated from a glass viewport 113 disposed in the thin film forming chamber 111 toward the optical spectrometer 112, a monitoring computer 115 for monitoring the intensity of hydrogen alpha rays measured by the optical spectrometer 112 and for monitoring the intensity of the oxygen radiation rays, gas supply sections 116, 117 for supplying the organosilicon compound gas and the oxidizing gas to the thin film forming chamber 111, a vacuum pump 118 for evacuating the space in the thin film forming chamber 111, a pressure meter 119 for measuring the pressure in the thin film forming chamber 111, and a high frequency power supply 120 for supplying the high frequency power to the thin film forming chamber 111.

(Thin Film Forming Chamber)

Figure 10:
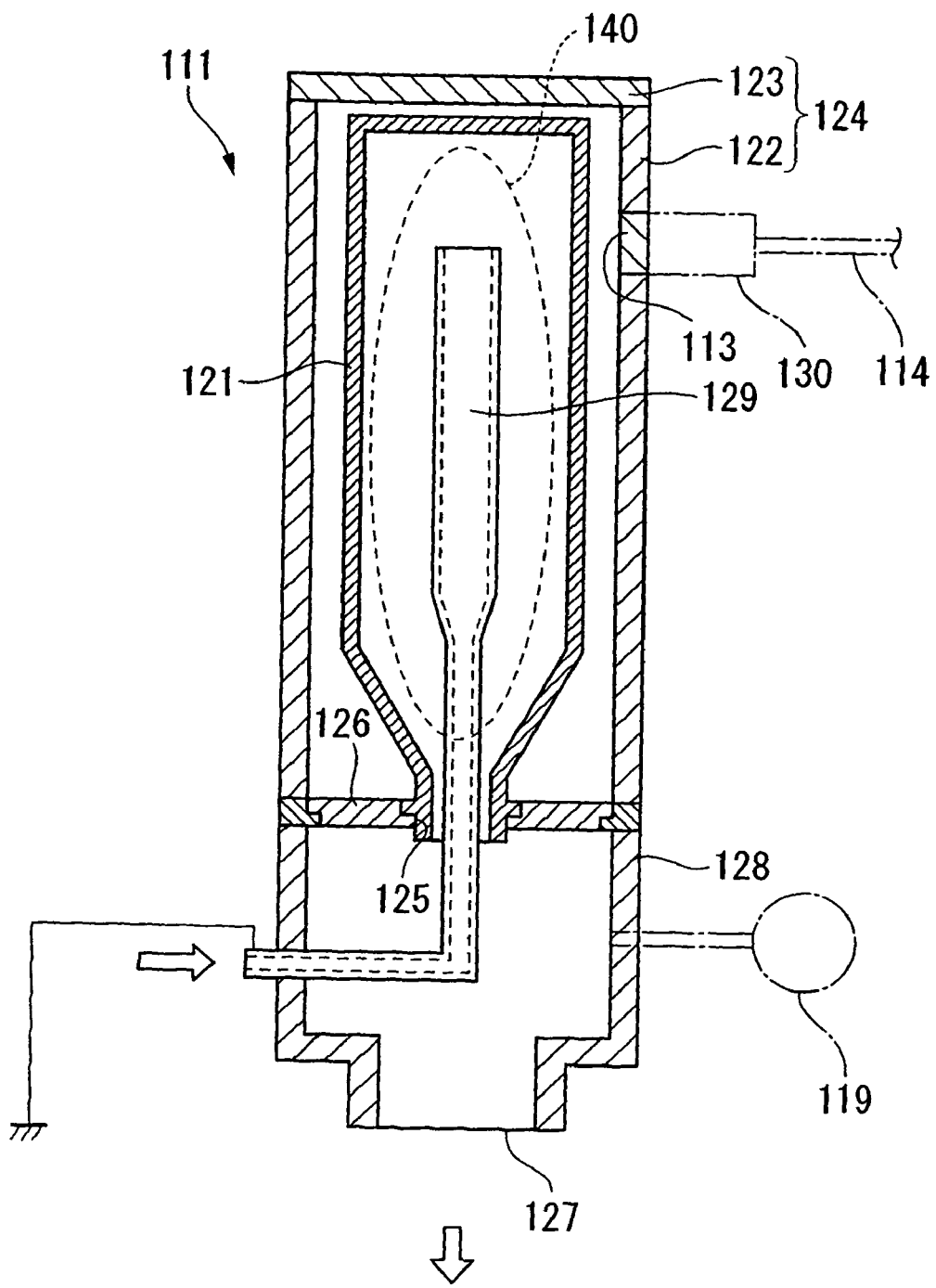
FIG. 10 is a cross section in which an example of the thin film forming chamber according to the present invention is shown.

As shown in FIG. 10, the thin film forming chamber 111 includes; an outer electrode 124 having a cylinder section 122 for containing a plastic container 121 (substrate), through which radiation can be transmitted, and a lid section 123 detachably disposed on the upper end surface of the cylinder section 122; an insulative plate 126, formed on the bottom end surface of the cylinder section 122, and having a supporting hole for supporting a port section of the container 121; a bottom section 128, disposed on the bottom end of the cylinder section 122 for covering the insulative plate 126, and having an exhausting port 127 on the bottom surface; a gas introducing pipe 129, of which the tip is introduced inside of the container 121 from outside of the thin film forming chamber 111 through a hole on a side surface of the bottom section 128 and a supporting hole 125 formed in the insulative plate 126; and a glass viewport 113, which is disposed on a side wall of the cylinder section 122, connecting to a tip section 130 of the optical fiber 114.

Here, the outer electrode 124 is connected to the high frequency power supply 120. The cylinder section 122 and the lid section 123, which form the outer electrode 124, are formed by a conductive member for supplying high frequency power from the high frequency power supply 120.

Also, the gas introducing pipe 129 introduces an organosilicon compound gas and an oxidizing gas into the container 121. In addition, the gas introducing pipe 129 is formed by a conductive member so as to serve as a ground electrode, when it is connected to ground.

Also, the pressure meter 119 is connected to the bottom section 128; thus, it is possible to measure the pressure in the thin film forming chamber 111.

(Measuring Section)

The optical spectrometer 112 includes: a first bandpass filter for separating only a specific wavelength range of radiation rays from either one of two sets of divided radiation rays, which are separated from the viewport 113 and transmitted to the optical spectrometer 112 through the optical fiber 114; a second bandpass filter for separating only the remainder of the specific wavelength range of the two sets of divided radiation rats; a first optical sensor for receiving radiation rays which pass through the first bandpass filter; and a second optical sensor for receiving radiation rays which pass through the second bandpass filter.

Here, in order to transmit only the wavelength (656 nm) of the hydrogen alpha rays and radiation rays which are close to this wavelength, the permeability of the radiation rays having a wavelength range outside of 656±5 nm is 1% or lower in the first bandpass filter.

Here, in order to transmit only this wavelength (777 nm) of the oxygen radiation rays and radiation rays which are close to the wavelength, the permeability of the radiation rays having a wavelength range outside of 777±5 nm is 1% or lower in the second bandpass filter.

It is possible to use a commonly-known photoelectric element such as a photo diode or a photo transistor for the optical sensor.

(Storing Section, Determining Section)

Figure 11:
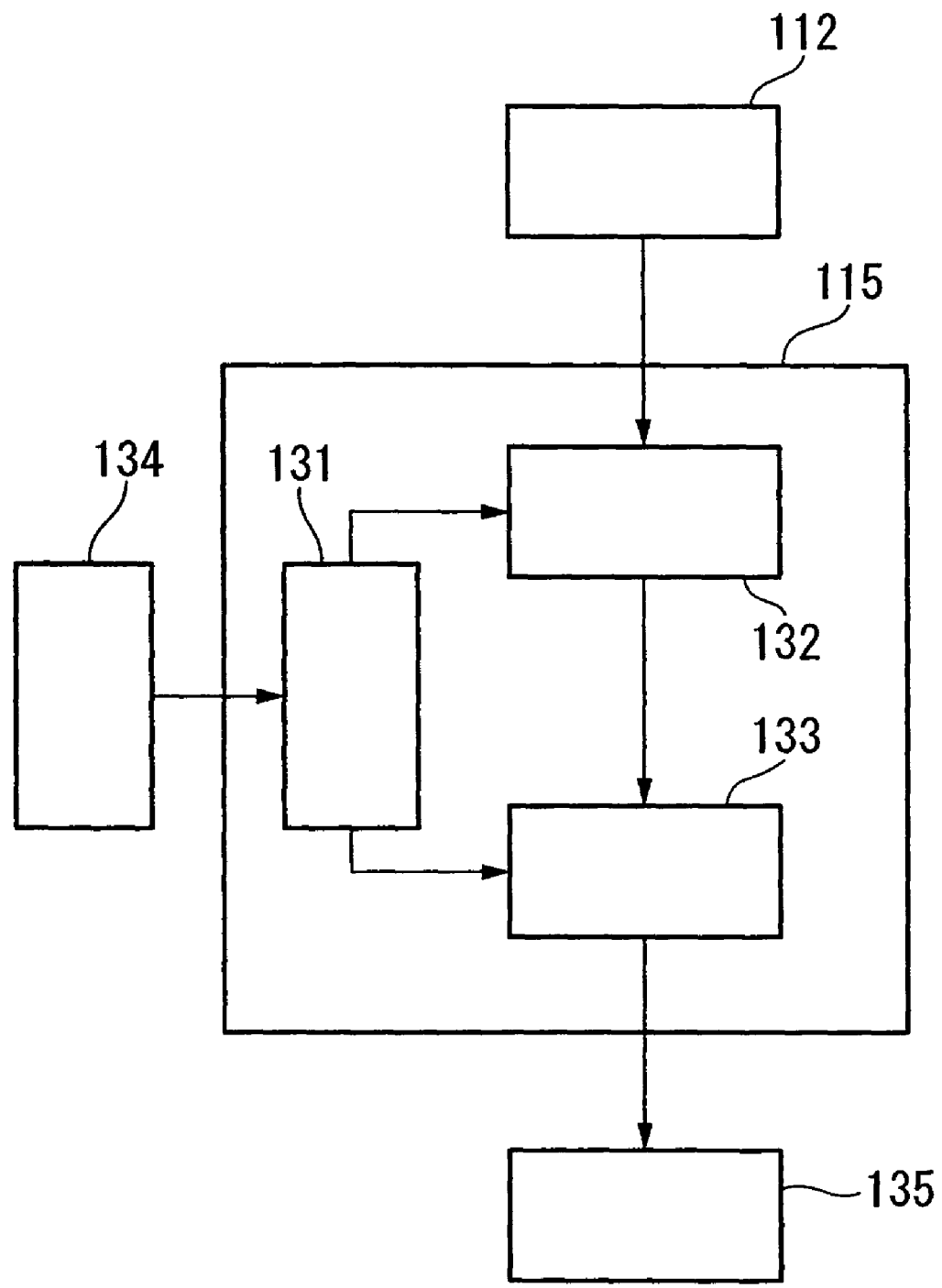
FIG. 11 is a general view in which an example of a monitoring computer according to the present invention is shown.

As shown in FIG. 11, as a general structure, the monitoring computer 115 includes a storing section 131 (storing section), a calculating section 132 (determining section), and a determining section 133 (determining section).

Here, the storing section 131 stores average values (or a center value) of the intensity of the hydrogen alpha rays and the intensity of the oxygen radiation rays as standard values, with respect to a previous thin film forming process in which the production process for the thin film was the same as that of the present thin film forming process, and in which the inspection results were successful (that is, an organosilicon thin film had a desirable surface quality). Also, the storing section 131 stores ranges of the intensity of the hydrogen alpha rays and the intensity of the oxygen radiation rays, which enable a silicon oxide thin film having a desirable surface quality to be obtained. These ranges represent a tolerable range (threshold) for the deviation of these intensity values from the standard values. Here, the storing section 131 may be a volatile memory such as a RAM (Random Access Memory), a hard disk device, an optical magnetic disc device, and a flash memory. Also, the storing section 131 may consist of a combination of these volatile memory devices.

The calculating section 132 calculates differences between the intensity of hydrogen alpha rays measured by the optical spectrometer 122 in the currently-operated thin film forming process and the standard value of the hydrogen alpha rays stored in the storing section 131, and between the intensity of the oxygen radiation rays measured by the optical spectrometer 112 and the standard value of the oxygen radiation rays stored in the storing section 131.

The determining section 133 determines whether or not the difference between these intensities and the standard values are in the tolerable ranges which are stored in the storing section 131.

The above-explained monitoring computer 115 may consist of a memory and a central processing unit (CPU). In order to execute the above functions, programs may be loaded into the memory. Also, the above-explained functions may be executed by hardware which is designed and produced for a specific use.

Also, peripherals, including an inputting device 134 such as a display touch panel, a switch panel, and a keyboard, and a peripheral apparatus, including an outputting device 135 such as a CRT monitor, a liquid display device, and a printer, may be connected to the monitoring computer 115.

The inputting device 134 stores standard values and tolerable ranges in the storing section 131 such that the standard values and the tolerable ranges are determined in accordance with the intensity of hydrogen alpha rays and the intensity of oxygen radiation rays, with respect to a previous thin film forming process in which the silicon oxide thin film having a desirable surface quality was produced.

For example, the outputting device 135 outputs: the intensity of the hydrogen alpha rays and the intensity of the oxygen radiation rays, which are measured by the optical spectrometer 112; the standard value of the hydrogen alpha rays and the standard value of the oxygen radiation rays which are stored in the storing section 131; the tolerable range of the intensity of the hydrogen alpha rays and the tolerable range of the oxygen radiation rays, which are stored in the storing section 131; and a determination result in the determining section 133, etc.

<Monitoring Method for Thin Film Forming Process>

Next, a thin film forming process and a monitoring method therefor are explained with reference to FIGS. 9 to 11.

Before starting the thin film forming process, average values (or a center value) for a quantity (intensity) of the hydrogen alpha rays and a quantity (intensity) of the oxygen radiation rays are inputted into the inputting device 134, and the inputted average values are stored in the storing section 131 in the monitoring computer 115 as standard values, such that the average values are based on a previous thin film forming process in which the silicon oxide thin film had a desirable surface quality in the same thin film forming process as the present thin film forming process. The tolerable range of each of the quantities of the radiation rays, which are determined based on records for the quantity (intensity) of the hydrogen alpha rays and the quantity (intensity) of the oxygen radiation rays, are inputted into the inputting device 34. The inputted tolerable ranges are stored in the storing section 131 in the monitoring computer 115, such that the quantities of the radiation rays are in accordance with a previous thin film forming process, in which the produced organosilicon thin film had a desirable surface quality.

The lid section 123 of the thin film forming chamber 111 is removed. The container 121 through which the radiation rays can be transmitted is put into the cylinder section 122 such that the gas introducing pipe 129 can be inserted into the container 121. The port section of the container 121 is engaged by the supporting hole 125 of the insulative plate 126 so as to be supported there. After that, the lid section 123 is attached onto thean upper end surface of the cylinder section 122.

Next, the vacuum pump 118 is started so as to depressurize the space in the thin film forming chamber 111 by exhausting the gas in the external electrode 124 from the exhausting port 127 through the insulative plate 126; thus, the pressure in the space in the thin film forming chamber 111 was a predetermined value (approximately a vacuum condition). After that, a gas which includes an organosilicon compound gas and an oxidizing gas is supplied from the gas supplying sections 116 and 117 to the thin film forming chamber 111. A mixture gas which includes the organosilicon compound gas and the oxidizing gas is introduced into the container 121 through the gas introducing pipe 129.

Next, the mixture gas is plasmatized between the external electrode 124 and the gas introducing pipe 129 serving as a ground electrode by starting the high frequency power supply 120 and supplying the high frequency power to the external electrode 124 in the thin film forming chamber 111. Thus, the organosilicon thin film is formed on the inner surface of the container 121.

During the thin film forming process, radiation rays which are radiated from a plasma 140 (inside the dotted line in the drawing) generated in the container 121 and which permeate through the transparent container 121 are separated from the viewport 113 so as to be transmitted to the optical spectrometer through the optical fiber 114. After the radiation rays which are transmitted to the optical spectrometer 112 are divided into two sets of rays, one of the sets of divided radiation rays are transmitted through the first bandpass filter. The hydrogen alpha rays which are transmitted there are received by the first optical sensor for measurement of the quantity (intensity) of the hydrogen alpha rays. Also, the other set of the two divided radiation rays are transmitted through the second bandpass filter. The oxygen radiation rays which are transmitted therethrough are received by the second optical sensor for measurement of the quantity (intensity) of the oxygen radiation rays.

The quantity (intensity) of the hydrogen alpha rays and the quantity (intensity) of the oxygen radiation rays which are measured by the optical spectrometer 112 are converted into voltages in accordance with the measured quantities; thus, the converted quantities are outputted to the monitoring computer 115.

The quantities of the radiation rays which are outputted to the monitoring computer 115 are treated as follows.

First, in the calculating section 132, the difference between the quantity (intensity) of hydrogen alpha rays measured by the optical spectrometer 122 and the standard value of the hydrogen alpha rays stored in the storing section 131 is calculated. Also, the difference between the quantity (intensity) of the oxygen radiation rays measured by the optical spectrometer 12 and the standard value of the oxygen radiation rays stored in the storing section 131 is calculated.

Next, the determining section 133 determines whether or not the differences between these quantities and the standard values are within the tolerable ranges which are stored in the storing section 131.

The determination result in the determining section 133 is outputted to the outputting device 133 together with the quantity (intensity) of the hydrogen alpha rays and the quantity (intensity) of the oxygen radiation rays which are measured by the optical spectrometer 112, the standard value of the hydrogen alpha rays and the standard value of the oxygen radiation rays which are stored in the storing section 131, and the tolerable range of the intensity of the hydrogen alpha rays and the tolerable range of the oxygen radiation rays which are stored in the storing section 131. Also, if the differences between the quantities of the radiation ray and the standard values for the radiation rays exceed the tolerable ranges which are stored in the storing section 131 as a result of the determination made in the determining section 133, an abnormality in the radiation rays which are emitted from the plasma may be reported to an operator by activating an alarm device and lamps, etc.

As organosilicon compounds which are used in the thin film forming process, it is possible to name, for example, tetramethyldisiloxane, hexamethyldisiloxane, vinyltrimethylsilane, methyltrimethoxysilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane methyl triethoxysilane, octamethylcyclotetrasiloxane, etc..

As the oxidizing gas, it is possible to name, for example, oxygen, carbon monoxide, carbon dioxide, and ozone, etc. Also, it is possible to mix argon or helium as a carrier gas into the organosilicon compound gas or the oxidizing gas.

In the above-explained monitoring method for the thin film forming process, the intensity of the hydrogen alpha rays and the intensity of the oxygen radiation rays which are radiated from the plasma during the thin film forming process are measured, and the measured intensities are compared with the intensity of the hydrogen alpha rays and the intensity of the oxygen radiation rays under the condition that a silicon oxide thin film which has a desirable surface quality is obtained. Therefore, it is possible to know reliably whether or not the process has been properly carried out (whether or not the plasma structure is normal). Also, it is possible to determine whether or not the produced thin film has a desirable surface quality during the process.

That is, if the mixture gas consisting of an organosilicon compound gas and an oxidizing gas is plasmatized, radiation rays having unique properties are radiated because various excited specimen exist in the plasma. These radiation rays include not only hydrogen alpha rays and oxygen radiation rays but also hydrogen beta rays, $SiO_2$ radiation, and $CH_3$ radiation. However, when the quantity (intensity) of the radiation rays emitted from the plasma generated in the container 121 is measured, the emitted radiation rays transmitted on a path from the container 121, through the container 121, the relatively small glass viewport 113, and the optical fiber 114 to the the optical spectrometer 112, into which the emitted radiation is finally introduced. The intensity of the emitted radiation is attenuated in the path. Therefore, if the intensities of the excited specimen, such as hydrogen beta rays, hydrogen gamma rays, SiO radiation, and $CH_3$ radiation, etc., having low intensities initially, are measured, measurement error increases undesirably. Therefore, it is possible to know reliably whether or not the structure of the plasma is normal by monitoring the intensity of hydrogen alpha rays, oxygen radiation rays, having relatively high intensities.

Also, the intensity of the two sets of radiation rays such as the hydrogen alpha rays and oxygen radiation rays are measured. Thus, it is possible to reliably detect an abnormality in various parameters (thin film forming pressure, supplied electricity, flow amounts of organosilicon compound gas and oxidizing gas) in the thin film forming process. That is, if an abnormality occurs in at least one of the parameters, the abnormality is indicated in at least the intensity of the hydrogen alpha rays or the intensity of the oxygen radiation rays. Therefore, it is possible to detect an abnormality of the process reliably.

Also, it is possible to detect an abnormality in the process more reliably by the thin film forming process monitoring method according to the present invention and by monitoring a process condition (for example, parameters such as degree of vacuum, supplied power, flow amount of an introduced gas).

Also, the above-explained thin film forming device includes: an optical spectrometer 121 for measuring the intensity of hydrogen alpha rays radiated from a plasma in the thin film forming chamber 111 and the intensity of the oxygen radiation rays; and a determining section 133, in which the intensity of the hydrogen alpha rays measured in the optical spectrometer 121 and the intensity of the hydrogen alpha rays stored in the storing section 131 are compared, the intensity of the oxygen radiation rays measured by the optical spectrometer 121 and the intensity of the oxygen radiation rays stored in the storing section 131 are compared, and whether or not the measured intensity of the hydrogen alpha rays and the measured intensity of the oxygen radiation rays are within tolerable ranges. Therefore, it is possible to know reliably whether or not the process is working properly and whether or not the structure of the plasma is normal. Also, it is possible to determine whether or not the produced thin film has a desirable surface quality during the process.

Also, the thin film forming device according to the present invention is not limited to the structure shown in the drawings. Thus, the thin film forming device may include: a chamber for plasmatizing a mixture gas consisting of an organosilicon compound gas and an oxidizing gas, and for forming a silicon oxide thin film on the surface of a substrate; a measuring section for measuring the intensity of hydrogen alpha rays and the intensity of an oxygen radiation rays, which are radiated from the plasma generated in the chamber; a storage section for storing the intensity of the hydrogen alpha rays and the intensity of the oxygen radiation rays such that the organosilicon thin film has a desirable surface quality which is measured in a previous thin film forming process; and a determining section for comparing the intensity of the hydrogen alpha rays measured by the measuring section with the intensity of the hydrogen alpha rays stored in the storage section, comparing the intensity of the oxygen radiation rays measured by the measuring section with the intensity of the oxygen radiation rays stored in the storage section, and determining whether or not the intensity of the measured hydrogen alpha rays and the intensity of the measured oxygen radiation rays are within a specific range.

For example, the measuring section is not limited to the optical spectrometer 121 which is shown in the drawings. Any measuring section is acceptable as long as it is possible to measure the intensity of hydrogen alpha rays and the intensity of oxygen radiation rays. However, if a bandpass filter for separating only a specific wavelength range of radiation rays from among the radiation rays radiated from the plasma in the thin film forming chamber is used, it is possible to simplify the measuring section at a low cost; therefore, the measuring section should preferably include a bandpass filter.

Also, any bandpass filter is acceptable as long as it is possible to extract hydrogen alpha rays or oxygen radiation rays from among the radiation rays which are radiated from the plasma.

Also, in the drawings, the plasma 140 is observed through the viewport 113 while traversing horizontally. However, it is acceptable if the viewport 113 is disposed on the lid section 123 so as to observe the plasma 140 from above. Also, it is acceptable if the viewport 113 is disposed diagonally in the cylinder section 122 so as to observe the plasma 140 diagonally downward from above. In order to separate the radiation rays radiated from the plasma in a longitudinal cylindrical container, it is preferable to observe the plasma diagonally downward from above because the quantity (intensity) of the radiation is high.

Also, the determining section (determining section 133) in the monitoring computer 115 in the drawing calculates a difference between the intensities of the measured hydrogen alpha rays and the measured oxygen radiation rays and the standard values of the radiation rays stored in the storing section 131 (calculating section 132) and determines whether or not the difference between these intensities and the standard values are within the tolerable ranges stored in the storing section 131 (determining section 133). However, in the present invention, the determining section is not limited to such a structure. For example, the storing section 131 may store an upper limit value and a lower limit value for the intensity of the hydrogen alpha rays and the intensity of oxygen radiation rays, and the determining section may determine whether or not the intensity of the measured hydrogen alpha rays and the intensity of the measured oxygen radiation rays are in a range between the upper limit value and the lower limit value, without calculating a difference between the intensity of the radiation rays and the standard value, such that the stored intensities for the hydrogen alpha rays and the oxygen radiation rays are determined in accordance with a previous thin film forming process in which the production process for the thin film was the same as that of the present thin film forming process.

Also, in the case in which the standard value of the hydrogen alpha rays and the standard value of the oxygen radiation rays which are stored in the storing section 131 fluctuate in the process while the intensity of the radiation fluctuates throughout the process, the standard value of the radiation may be stored in the storing section 131 over time in the process; thus, a tolerable range for the standard value may be set over time in the process. The process, in terms of several phases, can be divided into a beginning phase, a middle phase, and an approximate end phase.

Also, it is not necessary to use the monitoring computer 115 in the thin film forming process monitoring method according to the present invention. That is, it is acceptable if the intensity of the measured hydrogen alpha rays and the intensity of the oxygen radiation rays are outputted from the optical spectrometer 121 directly to an outputting device such as a monitor, and an operator monitors the outputted result and compares the intensity of these radiation rays to the measured intensity of the hydrogen alpha rays and the measured intensity of the oxygen radiation rays under the condition that the silicon oxide thin film which has a desirable surface quality is obtained; thus, it is determined whether or not the silicon oxide thin film which has a desirable surface quality is formed.

Also, the thin film forming process monitoring method according to the present invention is not limited to the thin film forming process in which high frequency waves are used. The thin film forming process monitoring method according to the present invention can be adapted to a thin film forming process in which microwaves are used.

Also, the substrate on which the thin film is formed in the present invention is not limited to a plastic container 121 through which radiation rays can be transmitted as shown in the drawings. The present invention can be adapted to various substrates such as a container, a film, and a sheet which are made of plastic, glass, or metal.

EXAMPLES

Examples of the present invention are shown below.

A silicon oxide thin film is formed on the inner surface of the container 21 which has a 500 ml capacity and is made of polyethyleneterephthalate by using the thin film forming device as shown in FIGS. 9 to 11. A mixture gas which includes hexamethyldisiloxane (hereinafter HMDSO) and oxygen is used as the process gas.

(Measurement of Standard Value)

The space in the thin film forming chamber 111 is depressurized by starting the vacuum pump 118 so as to have a predetermined thin film forming pressure (100 Pa). After that, the HMDSO and oxygen are supplied from the gas supplying sections 116, 117 to the thin film forming chamber 111. The mixture gas is introduced into the container 121 through the gas introducing pipe 129. Here, the flow amount of the HMDSO is 2 sccm. The flow amount of oxygen is 100 sccm.

Next, the mixture gas is plasmatized between the outer electrode 124 and the gas introducing pipe 129 serving as a ground electrode by starting the high frequency power supply 120 and supplying the 13.56 MHz high frequency waves to the outer electrode 124 in the thin film forming chamber 111 at 200 watts for 10 seconds; thus, the silicon oxide thin film is formed on an inner surface of the container 121.

Radiation rays which are radiated from the plasma 140 which is generated in the container 121 and permeated through the transparent container 121 are separated from the glass viewport 113 of which the diameter is 10 mm during the thin film forming process so as to be transmitted to the optical spectrometer 112 through the optical fiber 114 which has a 6 mm diameter and a 2 m length. After the radiation rays which are transmitted to the optical spectrometer 112 are divided into two sets of rays, one sets of the divided radiation rays is transmitted through the first bandpass filter of which the central wavelength is 656 nm. The hydrogen alpha rays which are transmitted there are received by the first optical sensor for measurement of a quantity (intensity) of the hydrogen alpha rays. Also, the other set of the two divided radiation rays is transmitted through the second bandpass filter of which the central wavelength is 777 nm. The oxygen radiation rays which are transmitted there are received by the second optical sensor for measurement of a quantity (intensity) of the oxygen radiation rays. A voltage in a range of 0 to 5 V is outputted from an optical sensor.

Also, the permeability of the oxygen in the container 121 on which a thin film is formed is measured in accordance with a Mocon method so as to evaluate a surface quality (oxygen impermeability) of the produced thin film. More specifically, the oxygen permeability is measured by using Mocon Inc.'s Oxitran 10/50. Here, the space inside of the cylindrical container 121 is under conditions of a 25° C. and a 90% nitrogen/hydrogen mixture gas atmosphere, and the outside space of the container 121 is at a 25° C. and 65% atmospheric condition.

TABLES 3 to 6 show various parameters (conditions) for the process such as the quantity of the measured hydrogen alpha rays, a quantity of the oxygen radiation rays, and the oxygen impermeability of the container 121 on which a thin film is formed.

It is found that the oxygen impermeability of the container 121 on which a thin film is formed is sufficiently low; thus, the container 121 has a desirable surface quality of the thin film. In addition, the thin film forming processes are repeated under the same condition. As a result, it is found that it is possible to form a thin film which has a desirable surface quality (oxygen impermeability) if the quantity of the hydrogen alpha rays are in a range of 3.0 to 3.4 V and the quantity of the oxygen radiation rays is in a range of 3.0 to 3.4 V. Therefore, the standard value is 3.2 and the tolerable range is ±2 V for the quantity of hydrogen alpha rays and oxygen radiation rays.

(Variance of Quantity due to Fluctuation of Flow Amount of HMDSO)

Next, the variance of the quantity of hydrogen alpha rays, the variance of the quantity of oxygen radiation rays, and the variance of the surface quality of a thin film are observed under condition that the flow amount of HMDSO fluctuates from 2 (sccm) to 1, 5, and 10 (sccm). Results are shown in TABLE 3.

The quantity of the obtained hydrogen alpha rays and the quantity of the obtained oxygen radiation rays indicate a fluctuation of the flow amount of HMDSO; thus, it is possible to estimate oxygen impermeability to some degree, which is one of the indexes for indicating the surface quality based on the quantity of each radiation.

TABLE 3

| HMDSO Flow Amount (sccm) | Flow Amount of Oxygen (sccm) | Applied Power (watts) | Pressure for Forming Thin Film (Pa) | Quantity of Hydrogen Alpha Rays (V) | Quantity of Oxygen radiation rays (V) | Impermeability of Oxygen (fmol/pkg · s · Pa) |
|---|---|---|---|---|---|---|
| 1 | 100 | 200 | 10 | 2.8 | 3.3 | 0.032 |
| 2 (Standard) | 100 | 200 | 11 | 3.2 | 3.2 | 0.012 |
| 5 | 100 | 200 | 13 | 3.4 | 2.8 | 0.043 |
| 10 | 100 | 200 | 15 | 3.4 | 2.5 | 0.054 |

(Variance of Quantity of Radiation due to Fluctuation of Flow Amount of Oxygen)

Next, the variance of the quantity of hydrogen alpha rays, the variance of the quantity of oxygen radiation rays, and the variance of the surface quality of a thin film are observed under condition that the flow amount of oxygen fluctuates from 100 (sccm) to 50 and 200 (sccm). The results are shown in TABLE 4.

The quantity of the obtained hydrogen alpha rays and the quantity of the obtained oxygen radiation rays indicate a fluctuation of the flow amount of oxygen; thus, it is possible to estimate oxygen impermeability to some degree, which is one of the indexes for indicating the surface quality based on the quantity of each radiation.

TABLE 4

| HMDSO Flow Amount (sccm) | Flow Amount of Oxygen (sccm) | Applied Power (watt) | Pressure for Forming Thin Film (Pa) | Quantity of Hydrogen Alpha Rays (V) | Quantity of Oxygen Radiation Rays (V) | Impermeability of Oxygen (fmol/pkg · s · Pa) |
|---|---|---|---|---|---|---|
| 2 | 50 | 200 | 8 | 3.3 | 3.3 | 0.021 |
| 2 | 100 (Standard) | 200 | 11 | 3.2 | 3.2 | 0.012 |
| 2 | 200 | 200 | 14 | 3.3 | 3.0 | 0.042 |

(Variance of Quantity of Radiation due to Fluctuation of Applied Power)

Next, the variance of the quantity of hydrogen alpha rays, the variance of the quantity of oxygen radiation rays, and the variance of the surface quality of a thin film are observed under the condition that the applied power fluctuates from 200 (watts), 100, and 300 (watts). The results are shown in TABLE 5.

The quantity of the fluctuated hydrogen alpha rays and the quantity of the fluctuated oxygen radiation rays indicate a fluctuation of the thin film forming pressure; thus, it is possible to estimate the oxygen impermeability to some degree, which is one of the indexes for indicating the surface quality based on the quantity of each radiation.

TABLE 5

| HMDSO Flow Amount (sccm) | Flow Amount of Oxygen (sccm) | Applied Power (watts) | Pressure for Forming Thin Film (Pa) | Quantity of Hydrogen Alpha Rays (V) | Quantity of Oxygen Radiation Rays (V) | Impermeability of Oxygen (fmol/pkg · s · Pa) |
|---|---|---|---|---|---|---|
| 2 | 100 | 100 | 11 | 2.9 | 2.9 | 0.033 |
| 2 | 100 | 200 (Standard) | 11 | 3.2 | 3.2 | 0.012 |
| 2 | 100 | 300 | 11 | 3.5 | 3.4 | 0.012 |

(Variance of Quantity of Radiation due to Fluctuation of Thin Film Forming Pressure)

Next, the variance of the quantity of hydrogen alpha rays, the variance of the qantity of oxygen radiation rays, and the variance of the surface quality of a thin film are observed under the condition that the thin film forming pressure fluctuates from 10 (Pa) to 20 and 50 (Pa) by varying the operation conditions of the vacuum pump 118. The results are shown in TABLE 6.

The quantity of the obtained hydrogen alpha rays and the quantity of the obtained oxygen radiation rays indicate a fluctuation of the thin film forming pressure; thus, it is possible to estimate oxygen impermeability to some degree, which is one of the indexes for indicating the surface quality based on the quantity of each radiation.

TABLE 6

| HMDSO Flow Amount (sccm) | Flow Amount of Oxygen (sccm) | Applied Power (watts) | Pressure for Forming Thin Film (Pa) | Quantity of Hydrogen Alpha Rays (V) | Quantity of Oxygen Radiation Rays (V) | Impermeability of Oxygen (fmol/pkg · s · Pa) |
|---|---|---|---|---|---|---|
| 2 | 100 | 200 | 11 (Standard) | 3.2 | 3.2 | 0.012 |
| 2 | 100 | 200 | 20 | 3.8 | 3.9 | 0.042 |
| 2 | 100 | 200 | 50 | 3.9 | 4.1 | 0.098 |

INDUSTRIAL APPLICABILITY

As explained above, such a thin film forming method includes a first thin film forming step in which the supply flow amount ratio is included within a specific range. Therefore, it is possible to form a thin film easily which has a desirable gas impermeability without variation in comparison with a method in which the supply flow amount ratio is strictly controlled in a range such that a thin film which has a desirable gas impermeability can be formed and plasmatization is performed while such a supply flow amount ratio is strictly maintained. Furthermore, by performing a second thin film forming step after this first thin film forming step, it is possible to form a thin film which has not only gas impermeability but also flexibility.

Also, according to the thin film forming device according to the present invention, it is possible to supply high frequency power from a high frequency power supply to a plurality of thin film forming chambers. Therefore, it is possible to strictly form a thin film which has a certain quality without variation for various substrates. Also, the facility cost is inexpensive and the facility size is compact.

Also, according to the thin film forming process monitoring method according to the present invention, the intensity of hydrogen alpha rays and the intensity of oxygen radiation rays are measured during the process. In addition, these intensities are compared to the intensity of hydrogen alpha rays and the intensity of oxygen radiation rays which are realized under previous condition in which an organosilicon thin film which has a desirable surface quality was obtained. Thus, it is possible to know the structure of the generated plasma more accurately and determine whether or not the surface quality of the produced thin film has a desirable condition during the process.

Also, if a specific wavelength range of radiation rays is separated from among the radiation rays which are radiated from the plasma; it is possible to measure the intensity of the radiation by an inexpensive and simple measuring device.

Also, since the thin film forming device according to the present invention has the above structure, it is possible to know the structure of the generated plasma more accurately and determine whether or not the generated thin film has a desirable quality during the process.

Also, if a bandpass filter is used which separates only a specific wavelength range of radiation rays from among the radiation rays which are radiated from the plasma in the thin film forming chamber, it is possible to simplify the measuring section at a low cost.

According to the present invention, in a thin film forming process which uses a plasma CVD method in which a silicon oxide thin film is formed on the surface of a substrate by plasmatizing a mixture gas which includes an organosilicon compound gas and an oxidizing gas, it is possible to know the structure of the generated plasma more accurately and determine whether or not the produced thin film has a desirable surface quality during the process.

The invention claimed is:

1. A thin film forming method for plasmatizing a mixture gas, the mixture gas consisting of a monomer gas and an oxidizing reactive gas, and for forming a thin film on a surface of a substrate, the thin film being made of an oxide, the method comprising:
    forming a first thin film by plasmatizing the mixture gas while varying a supply flow amount ratio of the monomer gas with respect to the reactive gas; and
    forming a final thin film by increasing the supply flow amount ratio of the monomer gas with respect to the reactive gas after the forming of the first film, wherein
    the forming of the first thin film is performed under a first condition that the supply flow amount ratio of the monomer gas with respect to the reactive gas decreases continuously at a constant speed from an initial value into a specific range of 0 to 0.05, the supply flow amount ratio remains within the specific range for 2 to 5 seconds, and the supply flow amount of the monomer gas is gradually reduced while the supply flow amount of the oxidizing reactive gas is maintained at a substantially fixed level; and the forming of the final thin film is performed under a second condition that the supply flow amount of the monomer gas increases at a constant speed and the supply flow amount of the reactive gas decreases at a constant speed, while the amount of the mixture gas is maintained at a substantially fixed level, the supply flow amount ratio of the monomer gas with respect to the reactive gas reaches 1000 or more, and the forming of the final thin film lasts for 1 to 3 seconds.

2. The thin film forming method according to claim 1, wherein the initial value of the supply flow amount ratio in the forming of the first thin film is in a range of 0.02 to 0.2.

3. The thin film forming method according to claim 1 or 2, wherein the mixture gas is plasmatized by controlling reflected power to be 10% or lower than supplied high frequency power, the reflected power being generated by supplying high frequency power of 100 MHz or lower to a high frequency electrode through an impedance matching network.

4. The thin film forming method according to claim 1, wherein the initial value of the supply flow amount ratio in the forming of the first thin film is in a range of 0.1 to 0.2.

5. The thin film forming method according to claim 4, wherein the mixture gas is plasmatized by controlling reflected power to be 10% or lower than supplied high frequency power, the reflected power being generated by supplying high frequency power of 100 MHz or lower to a high frequency electrode through an impedance matching network.

* * * * *

UNITED STATES PATENT AND TRADEMARK OFFICE
CERTIFICATE OF CORRECTION

PATENT NO.         : 8,062,716 B2
APPLICATION NO.    : 10/529362
DATED              : November 22, 2011
INVENTOR(S)        : Toshiaki Kakemura et al.

Page 1 of 1

It is certified that error appears in the above-identified patent and that said Letters Patent is hereby corrected as shown below:

Column 1, Line 8, Delete "Mar. 28, 2005," and insert -- Sep. 26, 2003, --, therefor.

Signed and Sealed this
Twentieth Day of March, 2012

David J. Kappos
*Director of the United States Patent and Trademark Office*